United States Patent
Yagi et al.

(10) Patent No.: US 7,923,274 B2
(45) Date of Patent: Apr. 12, 2011

(54) METHOD FOR FABRICATING THIN FILM TRANSISTOR ARRAY SUBSTRATE AND THIN FILM TRANSISTOR ARRAY SUBSTRATE

(75) Inventors: Toshifumi Yagi, Mie (JP); Toshihide Tsubata, Mie (JP); Yoshinori Shimada, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 352 days.

(21) Appl. No.: 11/991,360

(22) PCT Filed: May 29, 2006

(86) PCT No.: PCT/JP2006/310666
§ 371 (c)(1),
(2), (4) Date: Mar. 3, 2008

(87) PCT Pub. No.: WO2007/039954
PCT Pub. Date: Apr. 12, 2007

(65) Prior Publication Data
US 2009/0152560 A1 Jun. 18, 2009

(30) Foreign Application Priority Data
Sep. 30, 2005 (JP) .................................. 2005 288622

(51) Int. Cl.
*H01L 21/00* (2006.01)
(52) U.S. Cl. ................................ 438/30; 257/59; 257/72
(58) Field of Classification Search .................... 257/59, 257/72; 438/30
See application file for complete search history.

(56) References Cited

U.S. PATENT DOCUMENTS

| | | | |
|---|---|---|---|
| 6,043,511 A | * | 3/2000 | Kim |
| 6,323,051 B1 | * | 11/2001 | Shimada ........................ 438/30 |
| 6,657,695 B1 | * | 12/2003 | Song et al. |
| 6,661,488 B1 | * | 12/2003 | Takeda et al. |
| 6,738,120 B1 | * | 5/2004 | Song et al. |
| 6,759,281 B1 | * | 7/2004 | Kim et al. |

(Continued)

FOREIGN PATENT DOCUMENTS
EP 1 168 054 1/2002
(Continued)

OTHER PUBLICATIONS
International Search Report for PCT/JP2006/310666 mailed Jul. 11, 2006.

*Primary Examiner* — Kiesha R Bryant
*Assistant Examiner* — Mark W Tornow
(74) *Attorney, Agent, or Firm* — Nixon & Vanderhye P.C.

(57) ABSTRACT

After forming a gate electrode (4a) in a first step, a gate insulating film (5), a semiconductor film (8) and a conducting film (12) including a transparent conducting film (9) are stacked, and on the thus obtained multilayered body (18), a resist pattern (13a) including a first opening (14a) for exposing the conducting film (12) therein and a second opening (14b) having a bottom portion (B) above the gate electrode (4a) is formed. Portions of the conducting film (12) and the semiconductor film (8) exposed in the first opening (14a) are etched, the bottom portion (B) of the second opening (14b) is removed for exposing the conducting film (12) therein, and the exposed conducting film (12) is etched, so as to form a TFT (20) in a second step. A pixel electrode (5a), a protection masking layer (17a) and a projection (17b) are formed in a third step.

20 Claims, 16 Drawing Sheets

U.S. PATENT DOCUMENTS

| | | | |
|---|---|---|---|
| 6,900,084 B1 * | 5/2005 | Yamazaki | 438/158 |
| 7,071,037 B2 * | 7/2006 | Suzawa et al. | |
| 2002/0038998 A1 * | 4/2002 | Fujita et al. | |
| 2002/0079501 A1 * | 6/2002 | Okada et al. | |
| 2004/0106238 A1 * | 6/2004 | Lai | 438/151 |
| 2004/0218120 A1 * | 11/2004 | Ikeno et al. | 349/113 |

FOREIGN PATENT DOCUMENTS

| | | |
|---|---|---|
| JP | 03-060042 | 3/1991 |
| JP | 08-242004 | 9/1996 |
| JP | 09-152626 | 6/1997 |
| JP | 09-236827 | 9/1997 |
| JP | 2001-5038 | 1/2001 |
| JP | 2001-21894 | 1/2001 |
| JP | 2001-83523 | 3/2001 |
| JP | 2001-108823 | 4/2001 |
| JP | 2001-109009 | 4/2001 |
| JP | 2002-108250 | 4/2002 |
| JP | 2002-151522 | 5/2002 |
| JP | 2002-343811 | 11/2002 |
| JP | 2003-315788 | 11/2003 |
| JP | 2004-252479 | 9/2004 |

* cited by examiner

METHOD FOR FABRICATING THIN FILM TRANSISTOR ARRAY SUBSTRATE AND THIN FILM TRANSISTOR ARRAY SUBSTRATE

CROSS-REFERENCE TO RELATED APPLICATIONS

This application is the U.S. national phase of International Application No. PCT/JP2006/310666, filed 29 May 2006, which designated the U.S. and claims priority to Japanese Patent Application No. 2005-288622, filed 30 Sep., 2005, the entire contents of each of which are hereby incorporated by reference.

TECHNICAL FIELD

The present invention relates to a method for fabricating a thin film transistor array substrate and a thin film transistor array substrate, and more particularly, it relates to a thin film transistor array substrate included in an MVA liquid crystal display.

BACKGROUND ART

A liquid crystal display has various merits such as compactness, thinness, low power consumption and lightness and is widely used in a variety of electronic equipment. In particular, an active matrix liquid crystal display including a thin film transistor (TFT) as a switching element of each pixel has display performance equivalent to that of a CRT, and therefore, it is widely used in OA equipment such as a personal computer, AV equipment such as a television and a cellular phone. Particularly, the performance has been recently rapidly improved for attaining a large screen size, high refinement and a high aperture ratio.

With respect to an active matrix liquid crystal display thus applied in more fields, there is a demand for a lower price. In particular, various examinations have been made on methods for lowering the price by reducing the fabrication cost through improvement of productivity of a TFT array substrate included in an active matrix liquid crystal display, and among these methods, a method for reducing the number of photolithography processes employing photolithography, that is one of fabrication processes for a TFT array substrate, has been widely studied.

The photolithography process includes a series of steps of (1) applying a resist on a substrate having a thin film thereon; (2) forming a latent image of a mask pattern on the resist through optical exposure using a photomask; (3) patterning the resist through development and etching the thin film; and (4) removing the resist. This is an indispensable fabrication process in the fabrication of a TFT array substrate.

For example, each of Patent Documents 1, 2, 3 and 4 discloses a method for fabricating a transmission TFT array substrate in which the number of photolithography processes is reduced to four.

Also, each of Patent Documents 5, 6, 7 and 8 discloses a method for fabricating a transmission TFT array substrate in which the number of photolithography processes is reduced to three.

However, each of Patent Documents 5, 6 and 8 makes no detailed description on formation of a pixel electrode included in a pixel or an external leading electrode, and when the formation of such an element is considered, at least one photolithography process is necessary, which makes the number of photolithography processes four or more.

Moreover, Patent Document 7 discloses a method for fabricating a top-gate type TFT array, in which a channel portion of a semiconductor layer included in a TFT is not masked from light entering through an insulating substrate. Therefore, this technique has a problem that a photodielectric leakage current is caused so as to disadvantageously lower an on/off ratio (that is, a ratio between a current passing in an on state and a leakage current caused in an off state in switching a drain current in accordance with a gate voltage).

Furthermore, as known technique employed in a conventional liquid crystal display, a masking region designated as a black matrix is formed by using chromium or a black resin on a counter substrate disposed to oppose a TFT array substrate so as to overlay TFTs, gate lines and source lines provided on the TFT array substrate, and the TFT array substrate and the counter substrate are aligned to each other so as to prevent light from entering the TFTs and suppress occurrence of a photodielectric leakage current.

However, in consideration of an alignment margin in aligning the TFT array substrate and the counter substrate, it is necessary to form a large masking region, which disadvantageously lowers the aperture ratio of a pixel.

Therefore, in an attempt made to suppress the lowering of the aperture ratio of a pixel, a black matrix of a counter substrate is omitted by forming a masking film like a black resist on a TFT array substrate so as to cover TFTs, gate lines and source lines, so that the TFT array substrate and the counter substrate can be easily aligned.

Thus, the number of photolithography processes necessary to perform in the fabrication of the TFT array substrate is further increased by one for forming the masking film.

As described so far, at least four or more photolithography processes are necessary to perform in the fabrication of a TFT array substrate included in a transmission liquid crystal display.

In a liquid crystal display with a comparatively large screen used in a monitor of a personal computer or a liquid crystal television, vertical alignment (VA) having a multi-domain, that is, what is called MVA (multi-domain vertical alignment), has been recently widely spread (see, for example, Patent Documents 9, 10 and 11).

In an MVA liquid crystal display, at least either a pixel electrode provided on a TFT array substrate or a common electrode provided on a counter substrate is provided with a cut pattern (an electrode opening) or a projection for controlling orientation of liquid crystal molecules. In the MVA liquid crystal display, a wide viewing angle is realized by dispersing orientation directions of liquid crystal molecules in a pixel by using a fringe field formed by the cut pattern or inclined orientation of the liquid crystal molecules obtained on an inclined portion of the projection.

Also with respect to such an MVA liquid crystal display with high display quality, it is desired to lower the fabrication cost for lowering the price by reducing the number of photolithography processes for improving the productivity of a TFT array substrate as described above.

Patent Document 1: Japanese Laid-Open Patent Publication No. 9-152626

Patent Document 2: Japanese Laid-Open Patent Publication No. 9-236827

Patent Document 3: Japanese Laid-Open Patent Publication No. 2000-258799

Patent Document 4: Japanese Laid-Open Patent Publication No. 2001-5038

Patent Document 5: Japanese Laid-Open Patent Publication No. 3-60042

Patent Document 6: Japanese Laid-Open Patent Publication No. 8-242004

Patent Document 7: Japanese Laid-Open Patent Publication No. 2001-188252

Patent Document 8: Japanese Laid-Open Patent Publication No. 2002-343811

Patent Document 9: Japanese Laid-Open Patent Publication No. 2001-83523

Patent Document 10: Japanese Laid-Open Patent Publication No. 2001-21894

Patent Document 11: Japanese Laid-Open Patent Publication No. 2001-109009

DISCLOSURE OF THE INVENTION

Problems to be Solved by the Invention

The present invention was devised in consideration of the above-described situation, and an object of the invention is shortening the fabrication process and reducing the fabrication cost of a thin film transistor array substrate included in an MVA liquid crystal display by reducing the number of photolithography processes as compared with that in a conventional fabrication method.

Means for Solving Problems

According to the present invention, the number of photolithography processes performed in the fabrication process of a thin film transistor array substrate is reduced to three.

Specifically, the method for fabricating a thin film transistor array substrate of this invention is a method for fabricating a thin film transistor array including a plurality of pixels provided on a substrate; a plurality of thin film transistors each of which is disposed correspondingly to each of the plurality of pixels and includes a gate electrode, a source electrode, a drain electrode and a semiconductor layer having a channel portion formed correspondingly to the gate electrode; a source line connected to the source electrode; a pixel electrode connected to the drain electrode for applying a voltage through a liquid crystal layer including liquid crystal molecules; and a projection provided in the pixel electrode for controlling orientation of the liquid crystal molecules, and the method includes a first step of forming a pattern of the gate electrode on the substrate by photolithography; a second step of forming a pattern of the thin film transistors by forming a multilayered body by stacking, on the substrate where the gate electrode has been formed, a gate insulating film, a semiconductor film to be made into the semiconductor layer and a conducting film including a transparent conducting film and covering the semiconductor film, and by patterning the multilayered body by photolithography; and a third step of forming a protection layer covering the thin film transistors and the projection and of forming the pixel electrode by exposing a part of the transparent conducting film by photolithography, and the second step includes a resist pattern forming procedure for forming a resist film covering the multilayered body, and forming, in the resist film, a first opening exposing the conducting film therein and disposed above a portion other than a region where the channel portion, the source line, the source electrode and the drain electrode are formed, and a second opening having a bottom portion with a given thickness and disposed above a portion of the multilayered body corresponding to the channel portion; a first etching procedure for etching the conducting film exposed in the first opening and the semiconductor film disposed beneath the conducting film; and a second etching procedure for removing the bottom portion of the second opening for etching the conducting film exposed therein.

In this fabrication method, the pattern of the gate electrode is first formed in the first step.

Next, in the second step, the multilayered body is formed by stacking the gate insulating film, the semiconductor film and the conducting film including the transparent conducting film and covering the semiconductor film in this order on the substrate where the gate electrode has been formed, and after forming a resist film so as to cover the multilayered body, the first opening exposing the conducting film therein and disposed above a portion other than a region where the channel portion, the source line, the source electrode and the drain electrode are formed and the second opening having a bottom portion with a given thickness and disposed above a portion of the multilayered body corresponding to the channel portion are formed in the resist film, so as to form a resist pattern.

Then, after etching the conducting film exposed in the first opening of the resist pattern and the semiconductor film disposed beneath the conducting film, the bottom portion of the second opening is removed for exposing the conducting film therein and the conducting film exposed therein is etched, so as to form the pattern of the thin film transistor.

Subsequently, the protection layer covering the thin film transistor and the projection used for controlling the orientation of the liquid crystal molecules are formed and the pixel electrode is formed by exposing a part of the transparent conducting film in the third step.

Thus, the thin film transistor array substrate can be fabricated through the three photolithography processes of the first, second and third steps. Therefore, the fabrication process can be shortened and the fabrication cost can be reduced for a TFT array substrate included in an MVA liquid crystal display.

The conducting film may have a masking property, and a portion of the conducting film disposed inside the periphery of the drain electrode may be etched in the third step.

In this fabrication method, since the pixel electrode is formed by etching the portion of the conducting film disposed inside the periphery of the drain electrode, the peripheral portion of the pixel electrode with a transmission property is masked with the drain electrode made of the conducting film with the masking property. Therefore, light leakage between pixel electrodes can be suppressed.

The semiconductor film may include an upper first semiconductor film and a lower second semiconductor film, and the exposed conducting film and the first semiconductor film may be etched in the second etching procedure.

In this fabrication method, in the case where the upper first semiconductor film is, for example, an n+ amorphous silicon film and the lower second semiconductor film is an intrinsic amorphous silicon film, the conducting film exposed by removing the bottom portion of the second opening and the n+ amorphous silicon film used as the first semiconductor film are etched in the second etching procedure, so that the intrinsic amorphous silicon film used as the second semiconductor film is exposed, and thus the channel portion is formed.

A masking layer may be formed as an upper layer or a lower layer of the protection layer, and the masking layer may be formed simultaneously with the protection layer in the third step.

In this fabrication method, since the masking layer is formed as an upper layer or a lower layer of the protection layer, the masking layer is formed simultaneously with the protection layer. Therefore, the masking layer can be formed without increasing the number of photolithography processes.

The protection layer may be made of a material with a masking property.

In this fabrication method, since the protection layer is made of a material with a masking property, there is no need to perform a procedure for forming a masking film. Therefore, the fabrication process of the TFT array substrate can be shortened and the fabrication cost thereof can be reduced.

The gate electrode may be made of a first metal laminated film including a plurality of metal films stacked on one another, and the first metal laminated film may include a metal film made of an aluminum film or an aluminum alloy film.

In this fabrication method, the first metal laminated film used for forming the gate electrode includes a metal film made of an aluminum film or an aluminum alloy film. In general, an aluminum film or an aluminum alloy film is a low-resistance material, and hence, the wiring resistance is thus lowered.

The conducting film may include a single layer of the transparent conducting film.

In this fabrication method, since the conducting film includes a single layer of the transparent conducting film alone, there is no need to expose the transparent conducting film in the third step. Therefore, the pixel electrode is formed merely by forming the protection layer in the third step. As a result, the fabrication process of the TFT array substrate can be shortened and the fabrication cost thereof can be reduced.

The conducting film may include the transparent conducting film made of a compound of indium oxide and tin oxide, and a second metal laminated film covering the transparent conducting film and including a plurality of metal films stacked on one another, and the second metal laminated film may include a lower layer of a molybdenum film or a molybdenum alloy film and an upper layer of an aluminum film or an aluminum alloy film.

In this fabrication method, the molybdenum film or the molybdenum alloy film is formed on the transparent conducting film made of the compound of indium oxide and tin oxide (namely, an ITO film), and the aluminum film or the aluminum alloy film is formed on the molybdenum film or the molybdenum alloy film. Therefore, since the molybdenum film or the molybdenum alloy film is present between the aluminum film or the aluminum alloy film and the ITO film, formation of a local battery between the aluminum film or the aluminum alloy film and the ITO film is suppressed in etching the aluminum film or the aluminum alloy film. As a result, electric corrosion (galvanic corrosion) between the aluminum film or the aluminum alloy film and the ITO film can be suppressed.

The semiconductor film may be made of a material with higher transmissivity than amorphous silicon with the same thickness.

In this fabrication method, the semiconductor film is made of a material with higher transmissivity than amorphous silicon with the same thickness. Furthermore, the pixel electrode is covered with the semiconductor film. Therefore, the transmissivity of a region corresponding to the pixel electrode can be improved.

A plurality of gate lines each connected to the gate electrode and a gate line external leading electrode corresponding to an extended portion of each gate line may be formed simultaneously with the gate electrode in the first step.

In this fabrication method, the plural gate lines and the gate line external leading electrode corresponding to the extended portion of the gate line are simultaneously formed with the gate electrode, and therefore, the gate lines and the gate line external leading electrode are formed without increasing the number of fabrication processes. As a result, the fabrication process of the TFT array substrate can be shortened and the fabrication cost thereof can be reduced.

The gate electrode, the gate line and the gate line external leading electrode may be made of a first metal laminated film including a plurality of metal films stacked on one another, the first metal laminated film may include a titanium film or a titanium alloy film as a lowermost layer, and a portion of the titanium film or the titanium alloy film corresponding to the gate line external leading electrode may be exposed by etching in the third step.

In this fabrication method, the gate line external leading electrode is made of a titanium film or a titanium alloy film. Since the titanium film or the titanium alloy film is a material minimally oxidized, oxidation of the gate line external leading electrode is suppressed.

The first metal laminated film may include the titanium film or the titanium alloy film as the lowermost layer, a metal film made of an aluminum film or an aluminum alloy film, and a molybdenum film or a molybdenum alloy film covering the metal film.

In this fabrication method, since the molybdenum film or the molybdenum alloy film is easily etched with an etching used in etching the aluminum film or the aluminum alloy film, the gate line external leading electrode is definitely formed with the titanium film or the titanium alloy film corresponding to the lowermost layer of the first metal laminated film allowed to remain.

Furthermore, since the molybdenum film or the molybdenum alloy film is present on the metal film made of the aluminum film or the aluminum alloy film, formation of a projection (a hillock) on the aluminum film or the aluminum alloy film is suppressed by the molybdenum film or the molybdenum alloy film. Therefore, for example, interlayer leakage otherwise caused by a hillock penetrating an insulating film can be reduced.

Furthermore, the first metal laminated film includes the metal film made of the aluminum film or the aluminum alloy film. Therefore, since the aluminum film or the aluminum alloy film is a low-resistance material, the wiring resistance is lowered.

The gate electrode, the gate line and the gate line external leading electrode may be made of a first metal laminated film including a plurality of metal films stacked on one another, and the first metal laminated film may include a titanium film or a titanium alloy film as an uppermost layer.

In this fabrication method, a titanium film or a titanium alloy film is less oxidized than, for example, the metal film made of the aluminum film or the aluminum alloy film, the oxidation of the gate line external leading electrode is suppressed. Therefore, differently from the case where the metal film of the aluminum film or the aluminum alloy film, which is easily oxidized, is exposed, there is no need to etch the metal film easily oxidized in a portion corresponding to the gate line external leading electrode, and hence, the fabrication process is shortened and the fabrication cost is reduced.

The first metal laminated film may include an aluminum film or an aluminum alloy film, and portions of the protection layer and the gate insulating film disposed inside the periphery of the gate line external leading electrode may be etched in the third step.

In this fabrication method, the portions of the protection layer and the gate insulating film disposed inside the periphery of the gate line external leading electrode are etched, and hence, the aluminum film or the aluminum alloy film included in the first metal laminated film is not exposed. Also, since the uppermost layer of the first metal laminated film exposed through the etching is the titanium film or the titanium nitride film minimally oxidized, the gate line external leading electrode has a structure minimally oxidized.

The source line and a source line external leading electrode corresponding to an extended portion of the source line may be formed along a direction crossing the plurality of gate lines simultaneously with the source electrode in the second step.

In this fabrication method, since the source line and the source line external leading electrode corresponding to the extended portion of the source line are formed simultaneously with the source electrode, the source line and the source line external leading electrode are formed without increasing the number of fabrication processes. As a result, the fabrication process of the TFT array substrate can be shortened and the fabrication cost thereof can be reduced.

The gate electrode, the gate line and the gate line external leading electrode may be made of a first metal laminated film including a plurality of metal films stacked on one another, the source electrode, the source line and the source line external leading electrode may be made of a second metal laminated film including a plurality of metal films stacked on one another, and at least uppermost layers of the first metal laminated film and the second metal laminated film may be removed by etching in portions corresponding to the gate line external leading electrode and the source line external leading electrode in the third step.

In this fabrication method, at least the uppermost layers of portions of the multilayered films corresponding to the gate line external leading electrode and the source line external leading electrode are removed simultaneously with the formation of the pixel electrode, the multilayered structures of the portion corresponding to the gate line external leading electrode and the source line external leading electrode are changed without increasing the number of fabrication processes. As a result, the fabrication process of the TFT array substrate can be shortened and the fabrication cost thereof can be reduced.

The uppermost layer of each of the first metal laminated film and the second metal laminated film may be made of an aluminum film or an aluminum alloy film, or a multilayered film of a molybdenum film or a molybdenum alloy film stacked on an aluminum film or an aluminum alloy film.

In this fabrication method, the uppermost layers of portions of the multilayered films corresponding to the gate line external leading electrode and the source line external leading electrode are made of the aluminum film or the aluminum alloy film, or the multilayered film of the molybdenum film or the molybdenum alloy film stacked on the aluminum film or the aluminum alloy film. Therefore, the gate line external leading electrode and the source line external leading electrode are formed simultaneously with the formation of the pixel electrode, and hence, the fabrication process of the TFT array substrate can be shortened and the fabrication cost thereof can be reduced.

At this point, in the case where the uppermost layers of the multilayered films are made of the aluminum film or the aluminum alloy film, the aluminum film or the aluminum alloy film easily oxidized is removed, so as to suppress the oxidation of the gate line external leading electrode and the source line external leading electrode.

Alternatively, in the case where the uppermost layers of the multilayered films are made of the multilayered film of the molybdenum film or the molybdenum alloy film stacked on the aluminum film or the aluminum alloy film, the molybdenum film or the molybdenum alloy film stacked on the aluminum film or the aluminum alloy film suppresses the formation of a projection (a hillock) on the aluminum film or the aluminum alloy film.

Furthermore, in the case where an ITO film is formed beneath the molybdenum film or the molybdenum alloy film, since the molybdenum film or the molybdenum alloy film is present between the aluminum film or the aluminum alloy film and the ITO film, formation of a local battery between the aluminum film or the aluminum alloy film and the ITO film is suppressed in etching the aluminum film or the aluminum alloy film. As a result, electric corrosion (galvanic corrosion) between the aluminum film or the aluminum alloy film and the ITO film can be suppressed.

The protection layer may have a masking property and cover the thin film transistors, the gate line and the source line.

In this fabrication method, since the protection layer having a masking property is formed so as to cover the thin film transistor, the gate line and the source line, the protection layer prevents light from entering the thin film transistor (TFT) as well as functions as a masking pattern between pixels (namely, a black matrix). Therefore, there is no need to provide a black matrix on a counter substrate generally disposed to oppose the TFT array substrate, and hence, the fabrication process of the counter substrate is shortened. Also, occurrence of light leakage between pixels derived from an alignment shift between the TFT array substrate and the counter substrate and a photoleakage current in a TFT can be suppressed.

The gate line external leading electrode and the source line external leading electrode may be exposed by forming one opening correspondingly to at least one of the gate line external leading electrode and the source line external leading electrode by etching.

In this fabrication method, since each of the external leading terminals is exposed by forming one opening correspondingly to at least one of the gate line external leading electrode and the source line external leading electrode, no layer is present on and between the external leading terminals. Therefore, an external driver circuit can be easily and stably connected to each of the external leading terminals by, for example, a TAB (tape automated bonding) method. Furthermore, in the case where an external driver circuit is connected by forming an opening in each of the external leading electrodes, it is apprehended that a portion of a thin film disposed in the vicinity of the bottom of the opening may be peeled off so as to form an unstable cross-sectional structure designated as an overhang. Since each external leading electrode is exposed in one opening in this embodiment, an overhang can be avoided so as to attain stable connection with an external driver circuit.

A protection film included in the protection layer and the gate insulating film may be etched in portions outside the periphery of the drain electrode in the third step.

For example, in the case where the semiconductor film to be etched in the first etching procedure is not completely etched, it is apprehended that a part of the semiconductor film may remain between the pixel electrode and the source line. However, in the aforementioned method, when the semiconductor film and the gate insulating film are made of materials simultaneously etched, the remaining part of the semiconductor film is etched simultaneously with the gate insulating film in etching the protection film included in the protection layer and the gate insulating film in the portions disposed outside the periphery of the drain electrode in the third step. Therefore, a short-circuit between the pixel electrode and the source line is suppressed.

Also, the thin film transistor array substrate of this invention includes a plurality of pixels provided on a substrate; a plurality of thin film transistors each of which is disposed correspondingly to each of the plurality of pixels and includes a gate electrode, a source electrode, a drain electrode and a semiconductor layer having a channel portion formed correspondingly to the gate electrode; a source line connected to the source electrode; a pixel electrode connected to the drain electrode for applying a voltage through a liquid crystal layer including liquid crystal molecules; and a projection provided in the pixel electrode for controlling orientation of the liquid crystal molecules, and the thin film transistor array substrate is fabricated through a first step of forming a pattern of the gate electrode on the substrate by photolithography; a second step of forming a pattern of the thin film transistors by forming a multilayered body by stacking, on the substrate where the gate electrode has been formed, a gate insulating film, a semiconductor film to be made into the semiconductor layer and a conducting film including a transparent conducting film and covering the semiconductor film, and patterning the multilayered body by photolithography; and a third step of forming a protection layer covering the thin film transistors and the projection and of forming the pixel electrode by exposing a part of the transparent conducting film by photolithography, the second step includes a resist pattern forming procedure for forming a resist film covering the multilayered body, and forming, in the resist film, a first opening exposing the conducting film therein and disposed above a portion other than a region where the channel portion, the source line, the source electrode and the drain electrode are formed, and a second opening having a bottom portion with a given thickness and disposed above a portion of the multilayered body corresponding to the channel portion; a first etching procedure for etching the conducting film exposed in the first opening and the semiconductor film disposed beneath the conducting film; and a second etching procedure for removing the bottom portion of the second opening for etching the conducting film exposed therein, and the semiconductor film and the conducting film covering the semiconductor film are provided beneath the projection.

Effects of Invention

According to the present invention, a thin film transistor array substrate can be fabricated through the first step, the second step and the third step, namely, three photolithography processes, and therefore, the fabrication process is shortened and the fabrication cost is reduced for a thin film transistor array substrate included in an MVA liquid crystal display.

BRIEF DESCRIPTION OF DRAWINGS

FIG. 10 is a schematic cross-sectional view of the substrate on which a pixel electrode 9d, a protection masking layer 17a and a projection 17b are formed in the pixel electrode forming procedure of Embodiment 1, corresponding to a schematic cross-sectional view of the active matrix substrate 30a.

DESCRIPTION OF REFERENCE NUMERALS

Figure 1:
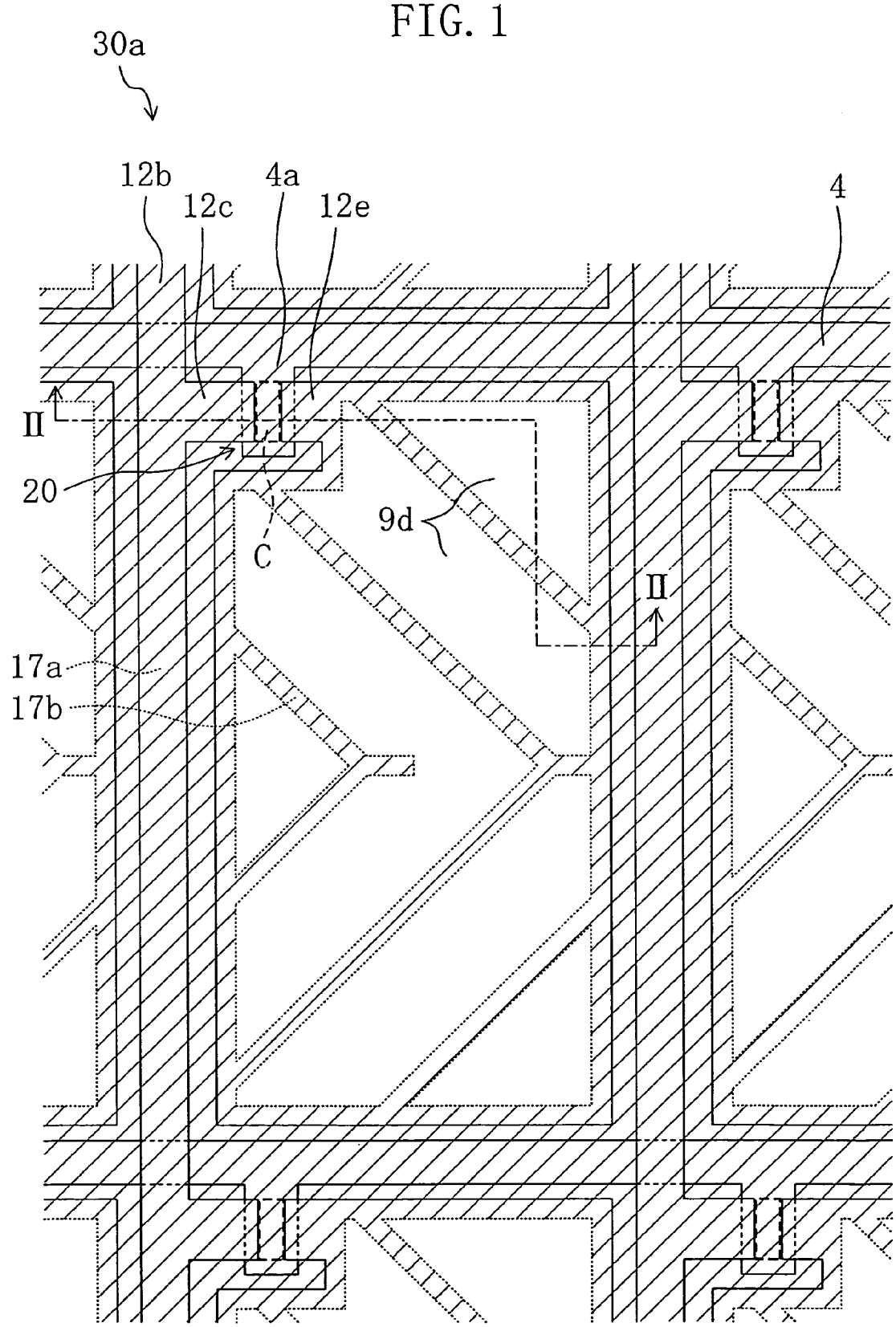
FIG. 1 is a schematic plan view of a TFT array substrate 30a of Embodiment 1.

B bottom portion
C channel portion
1 insulating substrate
2, 21 gate first metal film
3, 22 gate second metal film
4 gate line
4a gate electrode
4b gate line external leading electrode
5 gate insulating film
6 intrinsic amorphous silicon film (second semiconductor film)
7 n+ amorphous silicon film (first semiconductor film)
8, 24 semiconductor film
8a, 24a semiconductor layer
9, 25 transparent conducting film
9d, 25d pixel electrode
12 conducting film
12b source line
12c, 25b source electrode
12e, 25c drain electrode
12f source line external leading electrode
13a first resist pattern
13b second resist pattern
14a first opening
14b second opening
15a protection layer
16a masking layer
17b projection
17c opening
18 multilayered body
19a fist metal laminated film
19b second metal laminated film
20 thin film transistor (TFT)
23 gate third metal film
30a, 30b thin film transistor array substrate

BEST MODE FOR CARRYING OUT THE INVENTION

Embodiments of the invention will now be described with reference to the accompanying drawings. It is noted that the present invention is not limited to the embodiments described below.

Embodiment 1

A thin film transistor (TFT) array substrate 30a according to Embodiment 1 of the invention will now be described.

FIG. 1 is a schematic plan view of one pixel of the TFT array substrate 30a. The TFT array substrate 30a is included in a liquid crystal display together with an opposing counter substrate and a liquid crystal layer sandwiched between these substrates. It is noted that the liquid crystal layer has negative dielectric constant anisotropy ($\Delta_\in < 0$) and is made of nematic liquid crystal (liquid crystal molecules) of a vertical alignment type.

The TFT array substrate 30a includes, on an insulating substrate 1, a plurality of gate lines 4 extending in parallel and a plurality of source lines 12b extending in parallel and perpendicular to the gate lines 4 as shown in FIG. 1. A TFT 20 is provided on each crossing portion between the gate lines 4 and the source lines 12b. Furthermore, a pixel electrode 9d included in each pixel is provided correspondingly to each TFT 20 in a display region surrounded with a pair of gate lines 4 and a pair of source lines 12b. The pixel electrode 9d is partitioned by a projection 17b provided for controlling the orientation of the liquid crystal molecules. Moreover, an alignment film (not shown) is provided on the pixel electrode 9d. In addition, ends of each gate line 4 and each source line 12b are respectively provided with a gate line external leading terminal 4c and a source line external leading terminal 12g described below.

Figure 10:
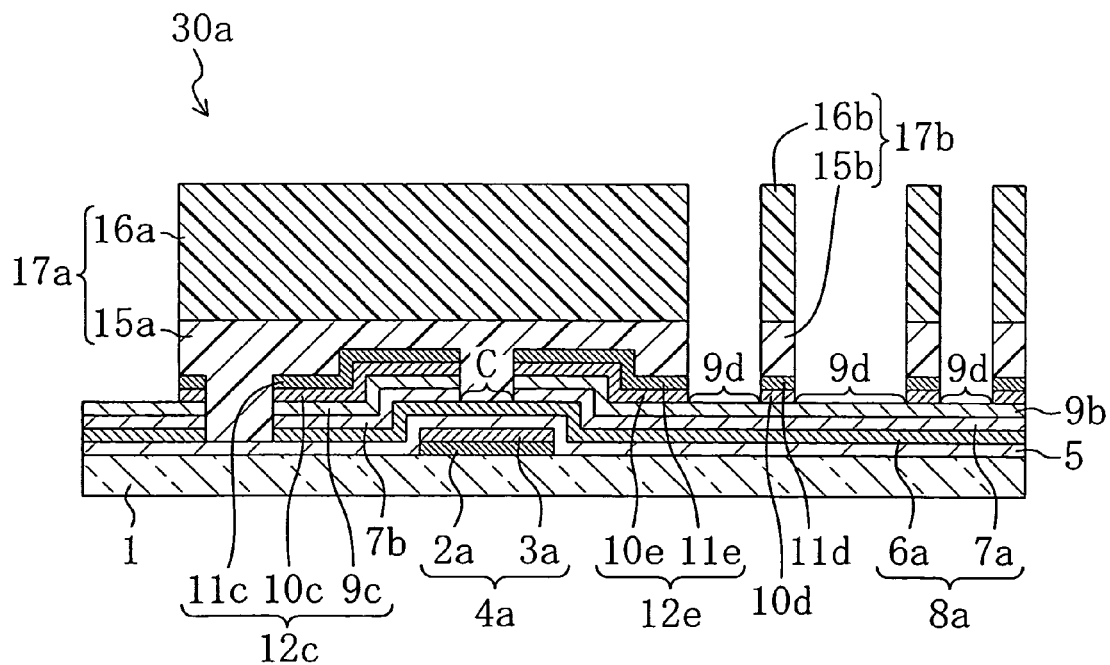

The TFT 20 includes, as shown in FIG. 10, a gate electrode 4a made of a convex protruded sideways from the gate line 4; a semiconductor layer 8a provided above the gate electrode 4a with a gate insulating film 5 sandwiched therebetween; a source electrode 12c made of a convex protruded sideways from the source line 12b on the semiconductor layer 8a; and a drain electrode 12e opposing the source electrode 12c on the semiconductor layer 8a and connected to the pixel electrode 9d. In the semiconductor layer 8a, a channel portion C is provided correspondingly to the gate electrode 4a in a region between the source electrode 12c and the drain electrode 12e. Furthermore, a protection masking layer 17a composed of a protection layer 15a and a masking layer 16a is provided so as to cover the TFT 20. The protection masking layer 17a is provided so as to cover also the gate lines 4 and the source lines 12b.

The projection 17b extends from the protection masking layer 17a disposed on the gate lines 4 and the source lines 12b and is provided so as to extend in an oblique direction against the extending directions of the gate lines 4 and the source lines 12b. The orientation of the liquid crystal molecules is divided by this projection 17b in one pixel, so as to increase the viewing angle of the liquid crystal display, namely, so as to realize an MVA (multi-domain vertical alignment) liquid crystal display.

Furthermore, although pixels are arranged in the form of a matrix and the gate lines 4 and the source lines 12b are perpendicular to each other in the TFT array substrate 30a of this embodiment, the present invention is applicable to a TFT array substrate including pixels provided, for example, in delta arrangement. It is noted that Embodiment 2 described below is also similarly applicable to this.

Moreover, although the gate electrode 4a of the TFT 20 is protruded sideways from the gate line 4 in this embodiment, the present invention is applicable to, for example, what is called a TFT on-gate structure in which a channel portion of a TFT is provided on a gate line 4. It is noted that Embodiment 2 described below is also similarly applicable to this.

Next, a method for fabricating the TFT array substrate 30a having the aforementioned structure will be described with reference to FIGS. 2 through 10. FIGS. 2 through 10 are schematic cross-sectional views taken on line II-II of FIG. 1. The TFT array substrate 30a is fabricated through a first step of a gate electrode forming procedure; a second step including a multilayered body forming procedure, a first resist pattern forming procedure, a first etching procedure, a second resist pattern forming procedure and a second etching procedure; and a third step of a pixel electrode forming procedure described below.

Figure 2:
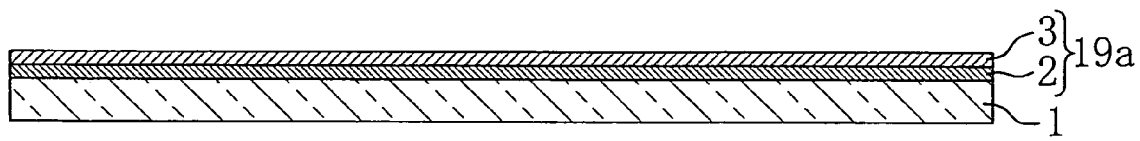
FIG. 2 is a schematic cross-sectional view, taken on line II-II of FIG. 1, of a substrate on which a first metal laminated film 19a is formed in a gate electrode forming procedure of Embodiment 1.
Figure 3:
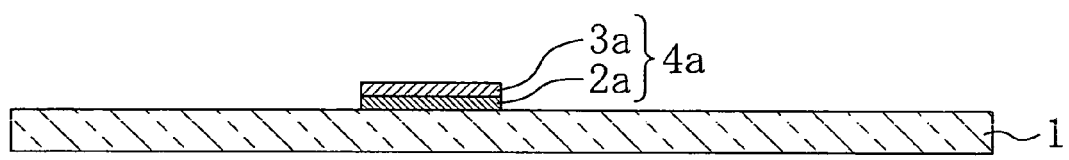
FIG. 3 is a schematic cross-sectional view of the substrate on which a gate electrode 4a is formed in the gate electrode forming procedure of Embodiment 1.

First, in the gate electrode forming procedure, a gate first metal film 2 (with a thickness of approximately 500 Å) of a titanium film and a gate second metal film 3 (with a thickness of approximately 3000 Å) of an aluminum film are successively formed over an insulating substrate 1 of a glass substrate or the like by sputtering, so as to form a first metal laminated film 19a as shown in FIG. 2.

Next, the first metal laminated film 19a is patterned by photolithography, so as to form a gate electrode 4a, a gate line 4 and a gate line external leading electrode 4c composed of a gate first metal layer 2a and a gate second layer 3a.

At this point, since the metal laminated film 19a used for forming the gate electrode 4a includes an aluminum film or an aluminum alloy film, that is, a low-resistance material, the wiring resistance of the gate line 4 can be lowered.

Alternatively, a molybdenum film or a molybdenum alloy film may be further patterned on the gate second metal layer 3a of the aluminum film. In this manner, the molybdenum film or the molybdenum alloy film formed on the aluminum film can suppress formation of a projection (a hillock) on the aluminum film. Therefore, occurrence of, for example, interlayer leakage otherwise caused by a hillock penetrating an insulating film can be reduced. At this point, a hillock means a projection formed on an aluminum film due to thermal history such as thermal process or plasma process. Moreover, the molybdenum film or the molybdenum alloy film can be easily etched with an etchant used in etching the aluminum film or the aluminum alloy film, such as a mixture of nitric acid, phosphoric acid and acetic acid, and hence, it is simultaneously removed through etching of the aluminum film described below and there is no need to perform separate etching.

Figure 4:
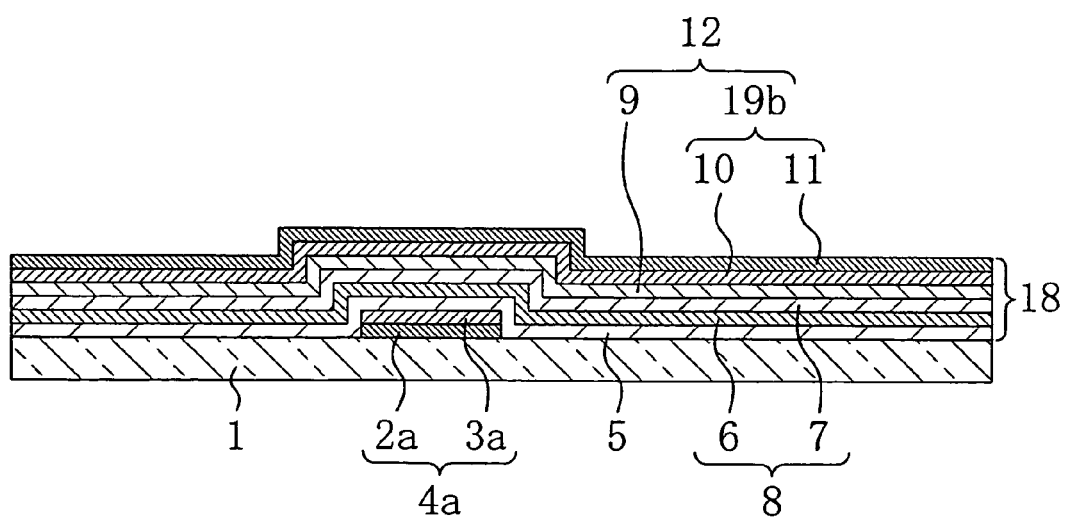
FIG. 4 is a schematic cross-sectional view of the substrate on which a multilayered body 18 is formed in a multilayered body forming procedure of Embodiment 1.

In the multilayered body forming procedure subsequently performed, a gate insulating film 5 (with a thickness of approximately 4000 Å) of a silicon nitride film, an intrinsic amorphous silicon film 6 (with a thickness of approximately 1500 Å) and an n$^+$ amorphous silicon film 7 (with a thickness of approximately 500 Å) doped with an impurity such as phosphorus are successively formed by plasma CVD over the substrate where the gate electrode 4a and the like have been formed as shown in FIG. 4. Subsequently, a transparent conducting film 9 (with a thickness of approximately 1000 Å) of an ITO (indium tin oxide) film, that is, a compound of indium oxide and tin oxide, a source first metal film 10 (with a thickness of approximately 1000 Å) of a molybdenum film and a source second metal film 11 (with a thickness of approximately 1000 Å) of an aluminum film are successively formed over the substrate by the sputtering.

Thus, a multilayered body 18 including the gate insulating film 5, the intrinsic amorphous silicon film 6, the n$^+$ amorphous silicon film 7, the transparent conducting film 9, the source first metal film 10 and the source second metal film 11 stacked successively in this order in the upward direction is formed. At this point, a semiconductor film 8 is a multilayered film of the intrinsic amorphous silicon film 6 and the n$^+$ amorphous silicon film 7, and a conducting film 12 is a multilayered film of the transparent conducting film 9 and a second metal laminated film 19b composed of the source first metal film 10 and the source second metal film 11.

Also, since the molybdenum film is present between the aluminum film and the ITO film, formation of a local battery between the aluminum film and the ITO film can be suppressed in subsequently etching the aluminum film. Therefore, electric corrosion (galvanic corrosion) between the aluminum film and the ITO film can be prevented. Furthermore, the transparent conducting film 9 is not limited to the ITO film but may be any film having a desired resistance value, such as an IZO (indium zin oxide) film, a zinc oxide film or a tin oxide film.

Moreover, although the molybdenum film is exemplarily used as the source first metal film 10 included in the second metal laminated film 19b in this embodiment, the source first metal film is not limited to this but may be a titanium film, a chromium film or an alloy film such as a molybdenum alloy film. Also, although the aluminum film is exemplarily used as the source second metal film 11 included in the second metal laminated film 19b, the source second metal film is not limited to this but may be an aluminum alloy film or the like.

In the first resist pattern forming procedure subsequently performed, a resist film is formed by applying a resist made of a photosensitive resin over the substrate so as to cover the multilayered body 18.

Figure 5:
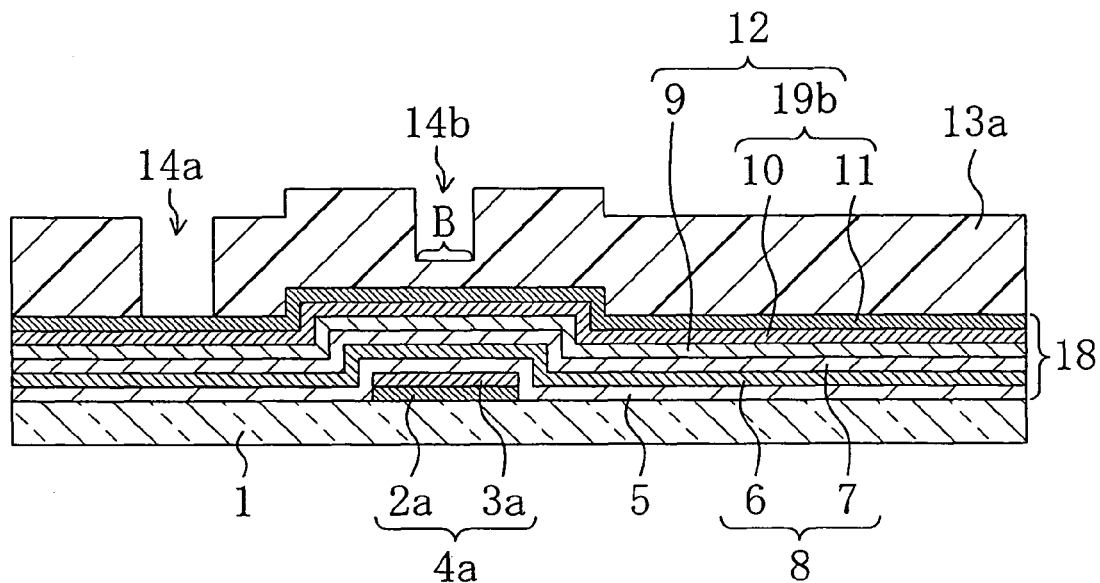
FIG. 5 is a schematic cross-sectional view of the substrate on which a resist pattern 13a is formed in a first resist pattern forming procedure of Embodiment 1.

Then, the resist film formed over the substrate is made into a first resist pattern 13a having a plurality of thicknesses as shown in FIG. 5 with exposure adjusted by using a slit mask or the like.

At this point, the first resist pattern 13a includes a first opening 14a exposing therein the conducting film 12, and more specifically the source second metal film 11, and disposed above a portion other than a region where a channel portion C, a source line 12b, a source electrode 12c and a drain electrode 12d are formed; and a second opening 14b having a bottom portion B with a given thickness and disposed above the gate electrode 4a, and more specifically above a portion corresponding to the channel portion C. An appropriate ratio in the thickness between the resist film in the second opening 14b and the resist film in another portion is varied in accordance with the conditions for etching and ashing subsequently performed, and the resist film has a thickness of, for example, approximately 15000 through 20000 Å in the second opening 14b and approximately 40000 Å in another portion.

Figure 6:
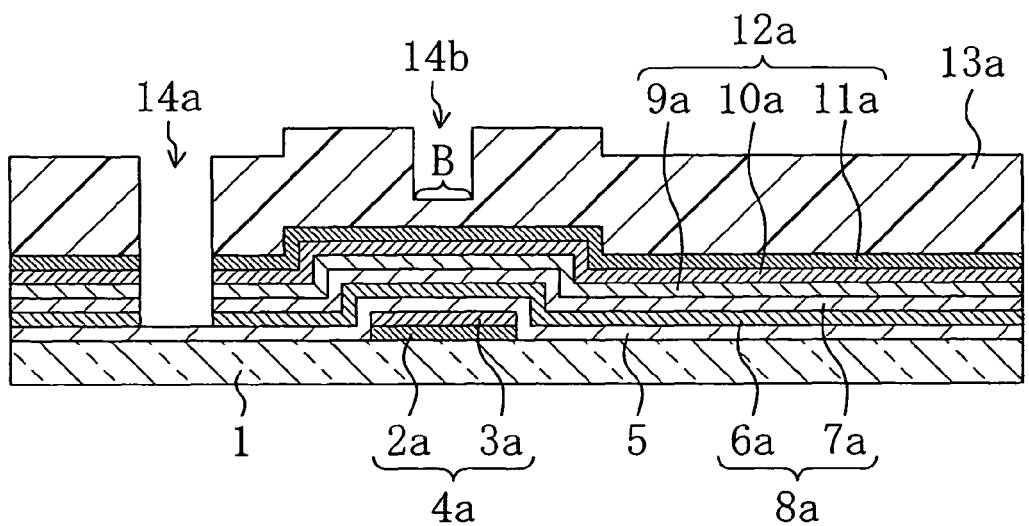
FIG. 6 is a schematic cross-sectional view of the substrate etched by using the first resist pattern 13a in a first etching procedure of Embodiment 1.

In the first etching procedure subsequently performed, the source second metal film 11, the source first metal film 10 and the transparent conducting film 9 are successively wet etched and then the n⁺ amorphous silicon film 7 and the intrinsic amorphous silicon film 6 are successively dry etched by using the first resist pattern 13a as a mask as shown in FIG. 6, so as to form a source/drain forming layer 12a composed of a transparent conducting layer 9a, a source first metal layer 10a and a source second metal layer 11a; and a semiconductor forming layer 8a composed of an intrinsic amorphous silicon layer 6a and an n⁺ amorphous silicon layer 7a.

Figure 7:
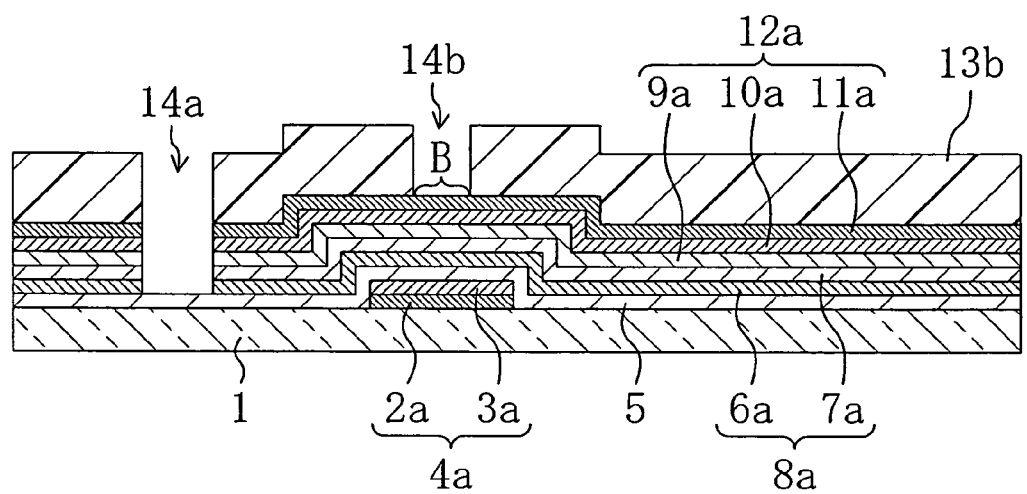
FIG. 7 is a schematic cross-sectional view of the substrate on which a second resist pattern 13b is formed in a second resist pattern forming procedure of Embodiment 1.

In the second resist pattern forming procedure subsequently performed, the whole first resist pattern 13a is ashed as shown in FIG. 7. Thus, the thickness of the first resist pattern 13a is reduced as a whole and the bottom portion B of the second opening 14b is removed, resulting in forming a second resist pattern 13b in which the conducting film 12, and specifically the source second metal layer 11a, is exposed.

Figure 8:
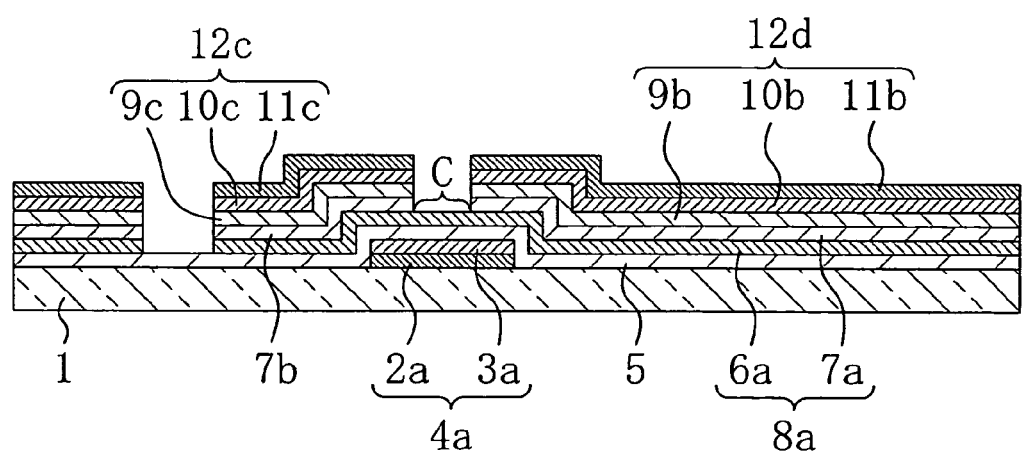
FIG. 8 is a schematic cross-sectional view of the substrate etched by using the second resist pattern 13b in a second etching procedure of Embodiment 1.
Figure 9:
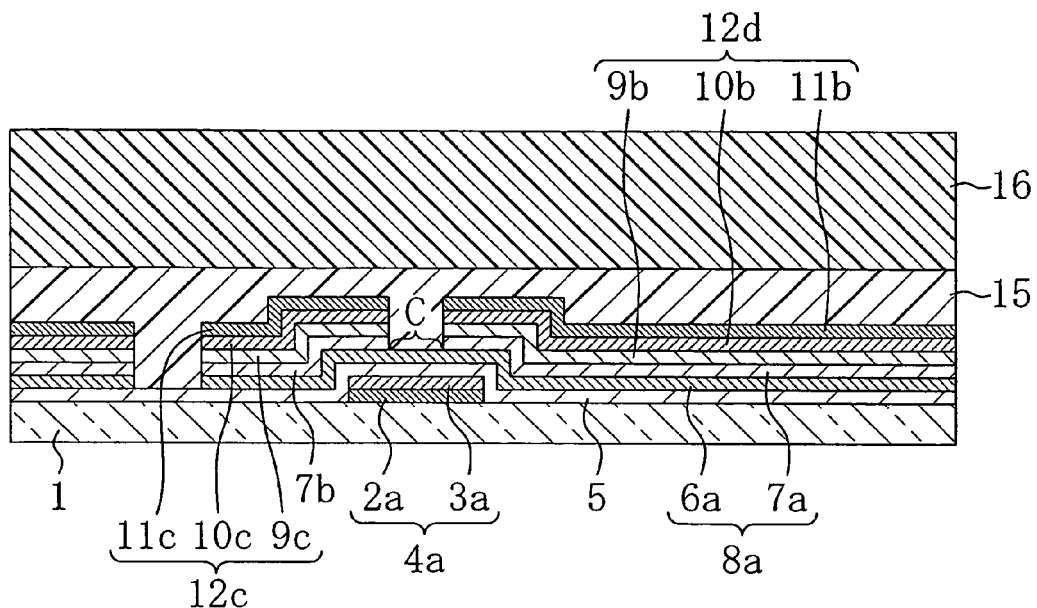
FIG. 9 is a schematic cross-sectional view of the substrate on which a protection film 15 and an orientation controlling film 16 are successively formed in a pixel electrode forming procedure of Embodiment 1.

In the second etching procedure subsequently performed, as shown in FIG. 8, the source second metal layer 11a, the source first metal layer 10a and the transparent conducting layer 9a are first wet etched by using the second resist pattern 13b as a mask, so as to form a source electrode 12c composed of a transparent conducting layer 9c, a source first metal layer 10c and a source second metal layer 11c; a drain electrode forming portion 12d composed of a transparent conducting layer 9b, a source first metal layer 10b and a source second metal layer 11b; a source line 12b; and a source line external leading electrode 12f.

Then, also by using the second resist pattern 13b as a mask, a channel portion C is formed by dry etching an n⁺ amorphous silicon layer 6b, so as to form a TFT 20, and thereafter, the second resist pattern 13b is removed.

In the pixel electrode forming procedure subsequently performed, a silicon nitride film (with a thickness of approximately 2000 Å) is deposited over the substrate by the plasma CVD so as to form a protection film 15.

Then, an orientation controlling film 16 (with a thickness of approximately 1.0 μm through 3.0 μm) is formed on the protection film 15 by the spin coating or the like. At this point, examples of the material for the orientation controlling film are a phenol novolak positive resist, a photosensitive acrylic resin solution and a photosensitive epoxy resin solution. Also, the protection film 15 or the orientation controlling film 16 preferably has a masking property. Examples of the material for such an orientation controlling film are a phenol novolak positive resist in which carbon is dispersed; and a photosensitive epoxy resin solution in which red, green and blue pigments are dispersed. When such a material is used, since the protection film 15 or the orientation controlling film 16 is made of a material with a masking property, there is no need to perform a procedure for forming a masking film. This can shorten the fabrication process and reduce the fabrication cost of the TFT array substrate. Furthermore, since the orientation controlling film 16 is formed on the protection film 15, the protection film 15 can be patterned by using a pattern of the orientation controlling film 16 as a mask in subsequent photolithography. Thus, the protection film 15 can be patterned without increasing the number of photolithography processes.

Thereafter, the orientation controlling film 16 formed over the substrate is subjected to exposure with a photomask used, development and post-bake, so as to form a masking layer 16a and a projection upper portion 16b.

Furthermore, by using the masking layer 16a and the projection upper portion 16b as a mask, the protection film 15 and the source second metal layer 11b and the source first metal layer 10b of the drain electrode forming portion 12d are etched for exposing a part of the transparent conducting layer 9b, so as to form a protection masking layer 17a composed of the masking layer 16a and a protection layer 15a; a drain electrode 12e composed of a source second metal layer 11e and a source first metal layer 10e; a projection 17b composed of the projection upper portion 16b and a projection lower portion 15b (and a source second metal layer 11d and a source first metal layer 10d); and a pixel electrode 9d. At this point, since the conducting film is etched in a portion disposed inside the periphery of the drain electrode 12e (corresponding to the drain electrode forming portion 12d), the periphery of the pixel electrode 9d with a transmission property is masked by the drain electrode 12e made of the drain electrode forming portion 12d with a masking property. Thus, light leakage between pixel electrodes 9d can be suppressed.

Furthermore, the protection masking layer 17a is formed so as to cover not only the TFT 20 but also the gate lines 4 and the source lines 12b. Thus, the protection masking layer 17a having a masking property prevents light from entering the TFT 20 as well as functions as a masking pattern between pixels (namely, a black matrix). Therefore, there is no need to provide a black matrix on a counter substrate generally provided to oppose the TFT array substrate, and the fabrication process of the counter substrate can be shortened. Moreover, light leakage between pixels and a photoleakage current occurring in a TFT derived from an alignment shift between the TFT array substrate and the counter substrate can be suppressed.

The active matrix substrate 30a is fabricated in the aforementioned manner.

Although the protection masking layer 17a exemplarily has a two-layered structure of the protection film 15 and the orientation controlling film 16 in this embodiment, it may have a one-layered structure of a photoresist with a masking property in which, for example, red, green and blue pigments are dispersed. In this case, the masking film can be omitted and hence there is no need to perform the procedure for forming the masking film. As a result, the fabrication process of the TFT array substrate can be shortened and the fabrication cost thereof can be reduced.

Moreover, although the conducting film is exemplarily etched in the portion disposed inside the periphery of the drain electrode 12e (the drain electrode forming portion 12d) in the pixel electrode forming procedure of this embodiment, the protection film 15 (the orientation controlling film 16) and the gate insulating film 5 may be etched in portions disposed outside the periphery of the drain electrode 12e instead.

Specifically, for example, in the case where the semiconductor film 8 to be etched in the first etching procedure is not completely etched, it is apprehended that a part of the semiconductor film 8 may remain between the pixel electrode 9d and the source line 12b. However, in etching the protection film 15 (the orientation controlling film 16) and the gate insulating film 5 in the portions disposed outside the periphery of the drain electrode 12e in the pixel electrode forming procedure, the remaining part of the semiconductor film 8 is etched simultaneously with the gate insulating film 5. Therefore, a short-circuit between the pixel electrode 9d and the source line 12b can be prevented. It is noted that this is also applicable to Embodiment 2 described below.

Next, the gate line external leading electrode 4b and the source line external leading electrode 12f will be described in more detail.

Figure 11:
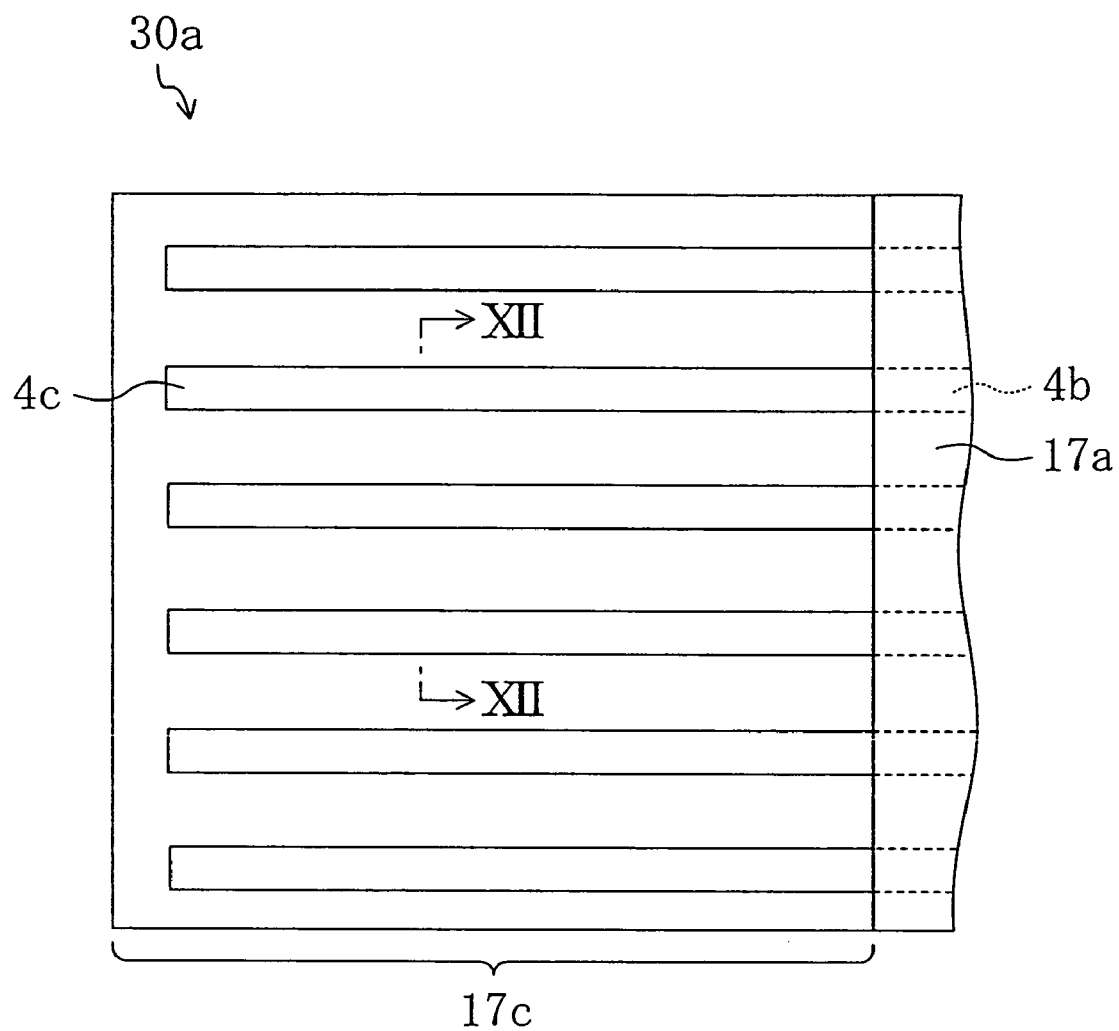
FIG. 11 is a schematic plan view of an end portion of the TFT array substrate 30a of Embodiment 1 showing a gate line external leading terminal 4c.
Figure 12:
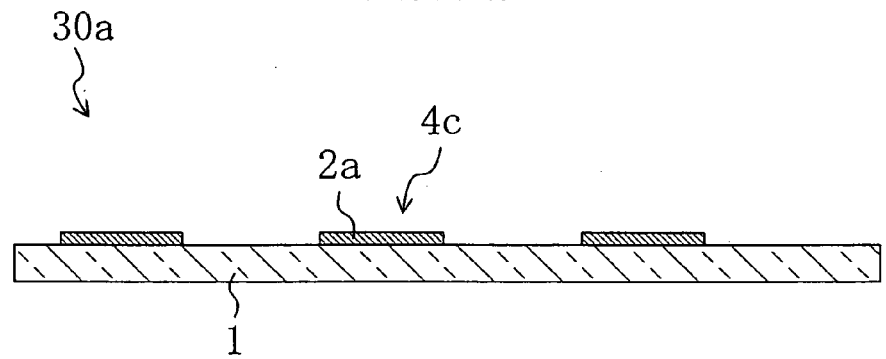
FIG. 12 is a schematic cross-sectional view of the TFT array substrate 30a taken on line XII-XII of FIG. 11.
Figure 15:
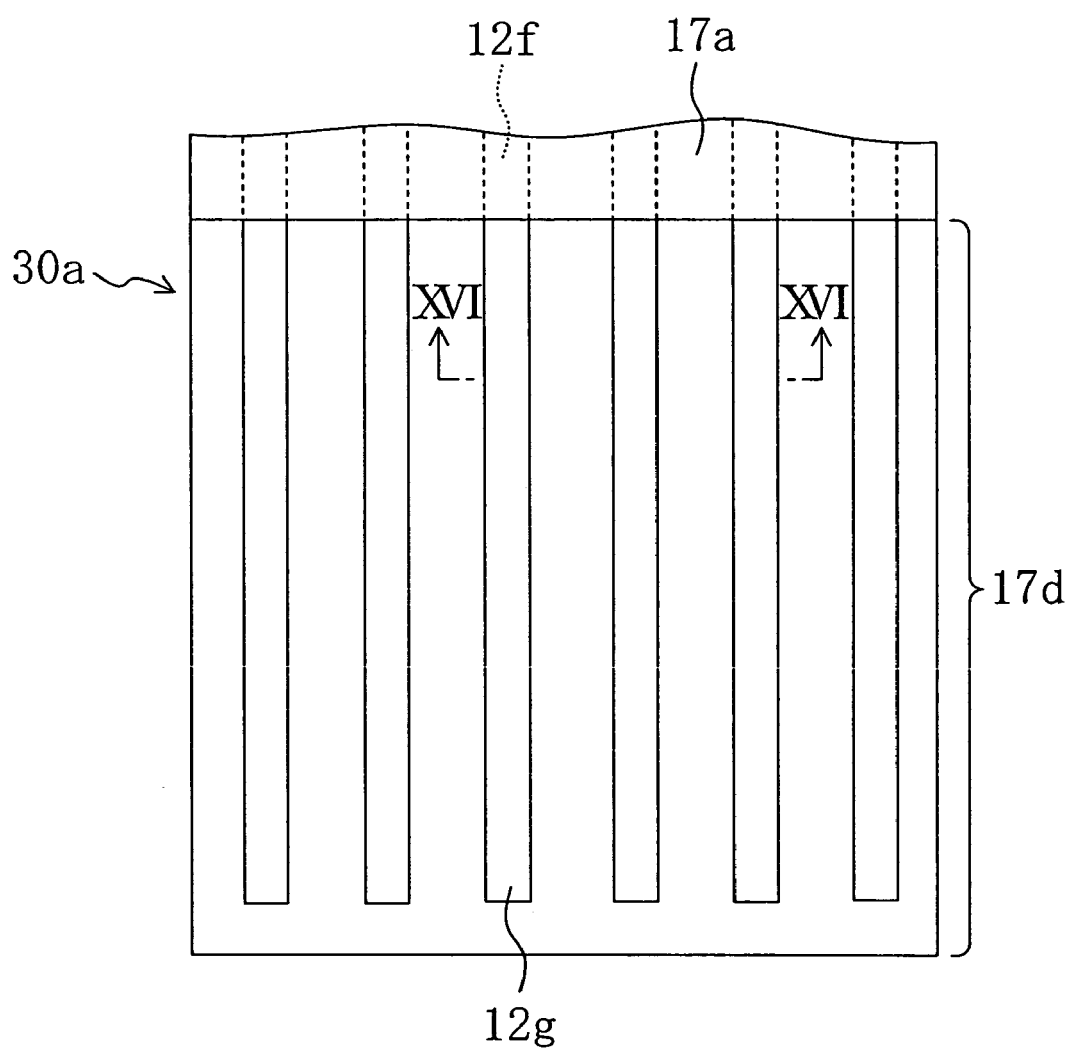
FIG. 15 is a schematic plan view of an end portion of the TFT array substrate 30a of Embodiment 1 showing a source line external leading terminal 12g.

FIG. 11 is a schematic plan view of an end portion of the TFT array substrate 30a in which a plurality of gate line external leading terminals 4c are provided, and FIG. 12 is a schematic cross-sectional view thereof taken on line XII-XII of FIG. 11. Also, FIG. 15 is a schematic plan view of an end portion of the TFT array substrate 30a in which a plurality of source line external leading terminals 12g are provided, and FIG. 16 is a schematic cross-sectional view thereof taken on line XVI-XVI of FIG. 15.

Figure 13:
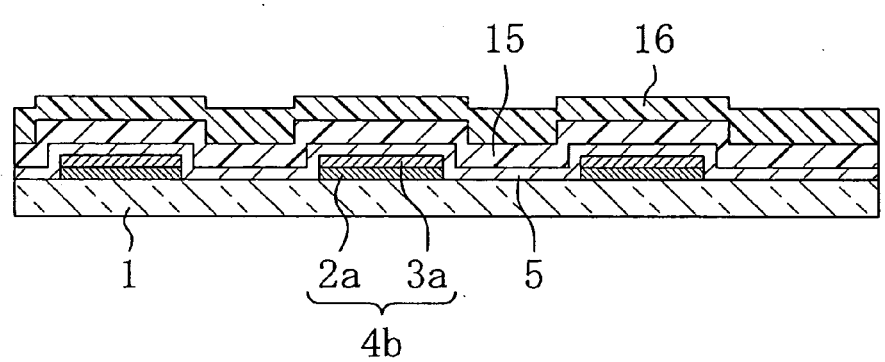
FIG. 13 is a schematic cross-sectional view, corresponding to FIG. 12, of the substrate on which the protection film 15 and the orientation controlling film 16 are successively formed in the pixel electrode forming procedure of Embodiment 1.
Figure 17:
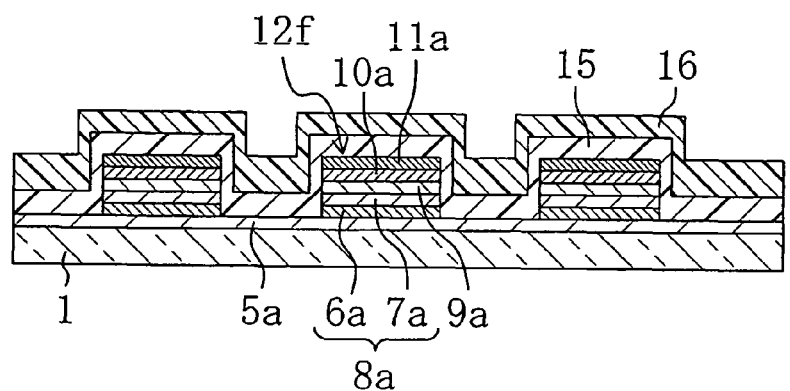
FIG. 17 is a schematic cross-sectional view, corresponding to FIG. 16, of the substrate on which the protection film 15 and the orientation controlling film 16 are successively formed in the pixel electrode forming procedure of Embodiment 1.

First, at a stage previous to the formation of the protection layer 15a and the masking layer 16a, the protection film 15 and the orientation controlling film 16 are formed on each gate line external leading electrode 4b and each source line external leading electrode 12f as shown in FIGS. 13 and 17.

Figure 14:
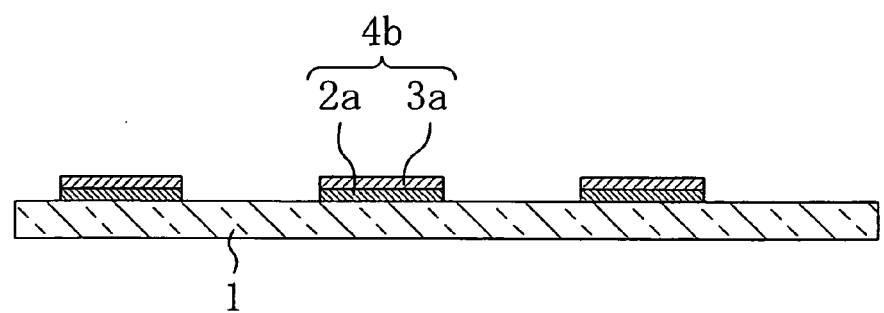
FIG. 14 is a schematic cross-sectional view, corresponding to FIG. 12, of the substrate on which the pixel electrode 9d, the protection masking layer 17a and the projection 17b are formed in the pixel electrode forming procedure of Embodiment 1.
Figure 18:
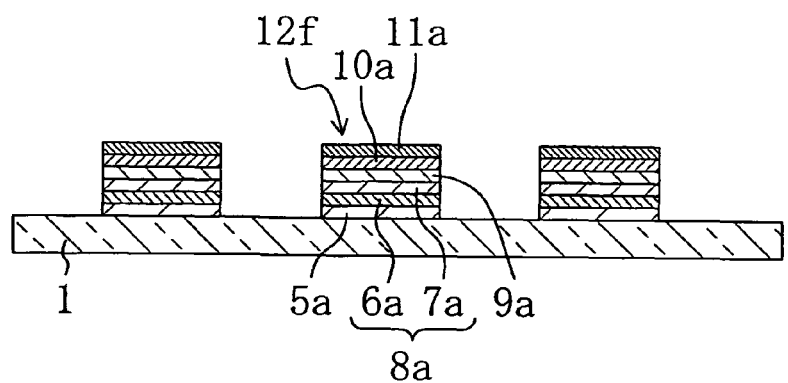
FIG. 18 is a schematic cross-sectional view, corresponding to FIG. 16, of the substrate on which the pixel electrode 9d, the protection masking layer 17a and the projection 17b are formed in the pixel electrode forming procedure of Embodiment 1.

Then, at the same time as the formation of the protection layer 15a and the masking layer 16a, the gate insulating film 5, the protection film 15 and the orientation controlling film 16 stacked on the gate line external leading electrode 4b and the protection film 15 and the orientation controlling film 16 stacked on the source line external leading electrode 12f are removed so as to respectively form openings 17c and 17d. Thus, the gate line external leading electrode 4b and the source line external leading electrode 12f are exposed as shown in FIGS. 14 and 18.

Figure 16:
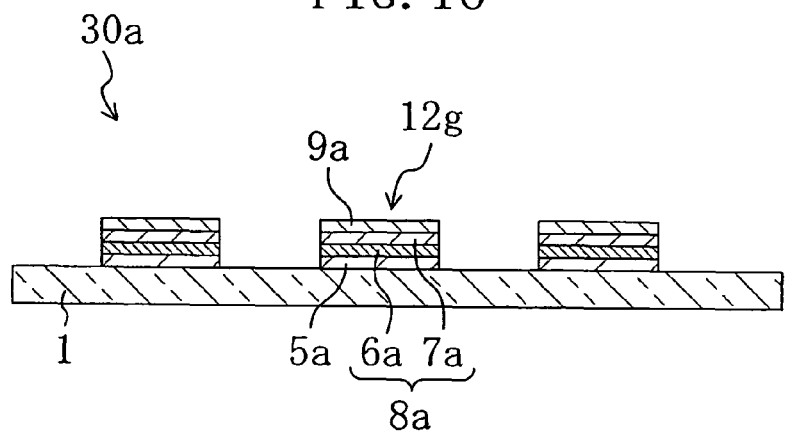
FIG. 16 is a schematic cross-sectional view of the TFT array substrate 30a taken on line XVI-XVI of FIG. 15.

Furthermore, since the gate second metal layer 3a corresponding to the uppermost layer of the gate line external leading electrode 4b and the source second metal layer 11a corresponding to the uppermost layer of the source line external leading electrode 12f are made of the aluminum films in this embodiment, at the same time as the gate line external leading electrode 4b and the source line external leading electrode 12f are exposed, the gate second metal layer 3a and the source second metal layer 11a (and the source first metal layer 10b) are respectively etched as shown in FIGS. 12 and 16, resulting in forming the gate line external leading terminal 4c in which the gate first metal layer 2a is exposed and the source line external leading terminal 12g in which the transparent conducting layer 9a is exposed. In this manner, the aluminum film easily oxidized can be removed in each external leading electrode, and hence, oxidation of the gate line external leading electrode 4b and the source line external leading electrode 12f can be prevented.

The aluminum film (the aluminum alloy film) used for forming the gate second metal layer 3a or the source second metal layer 11a may be made of a multilayered film of an aluminum film (an aluminum alloy film) and a molybdenum film (a molybdenum alloy film) stacked thereon.

In this case, the molybdenum film (the molybdenum ally film) stacked on the aluminum film (the aluminum alloy film) can suppress formation of a projection (a hillock) on the aluminum film (the aluminum alloy film).

Moreover, in the case where an ITO film is formed beneath the molybdenum film (the molybdenum alloy film), since the molybdenum film (the molybdenum alloy film) is present between the aluminum film (the aluminum alloy film) and the ITO film, a local battery can be prevented from being formed between the aluminum film (the aluminum alloy film) and the ITO film in etching the aluminum film (the aluminum alloy film), so as to prevent electric corrosion (galvanic corrosion) between the aluminum film (the aluminum alloy film) and the ITO film.

At this point, since the molybdenum film is formed as a lower layer in the source line external leading electrode 12f, it can be etched simultaneously with the aluminum film provided as an upper layer by the wet etching using, as an etchant, a mixed solution of nitric acid, phosphoric acid and acetic acid.

Furthermore, since each of the gate line external leading terminals 4c (the gate line external leading electrodes 4b) and the source line external leading terminals 12g (the source line external leading electrodes 12f) is exposed in one opening, no thin film material is present on and between the gate line external leading terminals 4c and the source line external leading terminals 12g as shown in FIGS. 12 and 16, and hence, an overhang described below is not caused. Therefore, an external driver circuit can be easily and stably connected to each of the gate line external leading terminals 4c and the source line external leading terminals 12g by, for example, a TAB (tape automated bonding) method.

Figure 32:
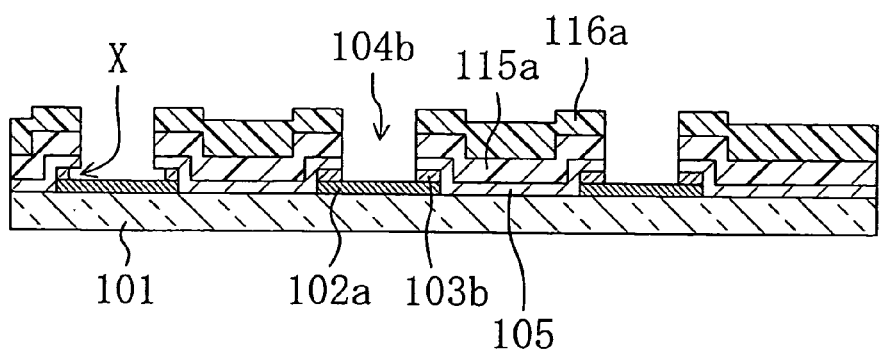
FIG. 32 is a schematic cross-sectional view corresponding to FIG. 12 obtained in a pixel electrode forming procedure described as a comparative example of Embodiment 1.
Figure 33:
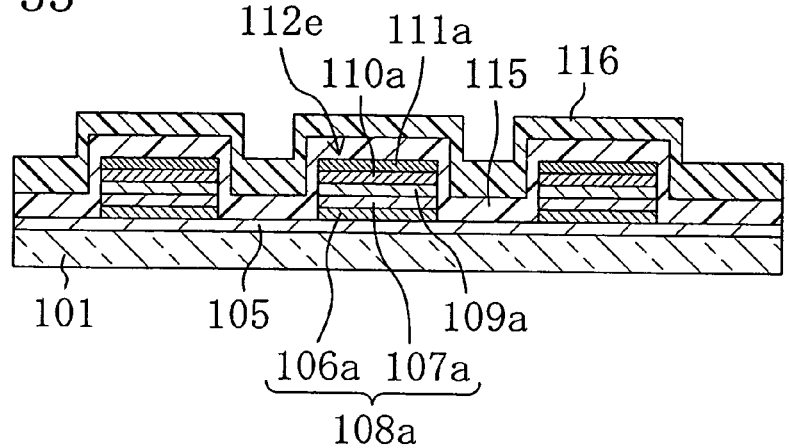
FIG. 33 is a schematic cross-sectional view corresponding to FIG. 17 obtained in a pixel electrode forming procedure described as a comparative example of Embodiment 1.
Figure 34:
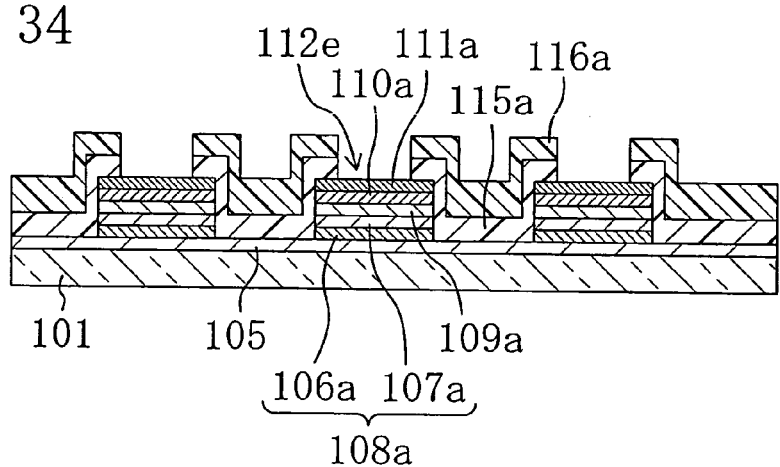
FIG. 34 is a schematic cross-sectional view corresponding to FIG. 18 obtained in a pixel electrode forming procedure described as a comparative example of Embodiment 1.
Figure 35:
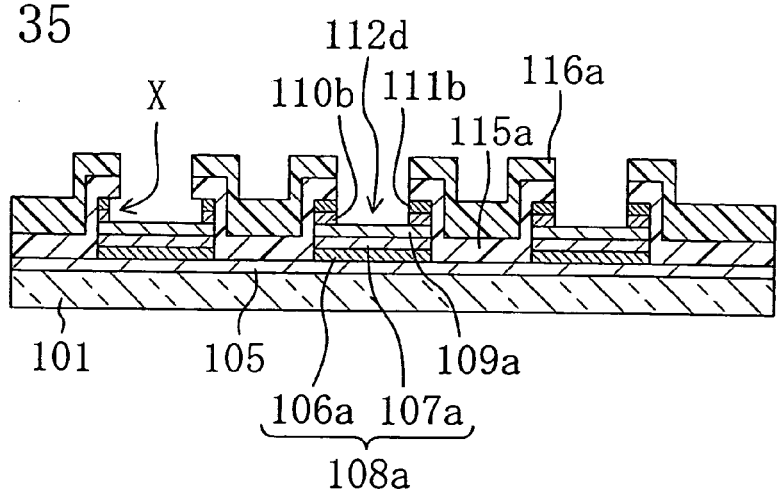
FIG. 35 is a schematic cross-sectional view corresponding to FIG. 16 obtained in a pixel electrode forming procedure described as a comparative example of Embodiment 1.

On the contrary, in the case where a contact hole is formed for each external leading electrode for connection with an external driver circuit, a gate second metal layer 103a or a source first metal layer 110a and a source second metal layer 11a are isotropically wet etched on the bottom of the contact hole as shown in FIGS. 32 and 35, and hence, an unstable cross-sectional structure designated as an overhang in which the film can be easily peeled off because no thin film is present in a lower portion is caused as shown in a region X in the drawing. Therefore, the connection between the external leading electrode (terminal) and the external driver circuit is unstable. It is noted that schematic cross-sectional views of FIGS. 30 through 32 and 33 through 35 respectively correspond to the schematic cross-sectional views of FIGS. 12 through 14 and 16 through 18.

Although the metal film corresponding to the lower layer of the first metal laminated film 19a included in the gate line 4, the gate electrode 4a and the gate line external leading electrode 4b is exemplarily made of a titanium film in this embodiment, the metal film is not limited to the titanium film but may be a chromium film, a molybdenum film or the like.

However, in the case where a titanium film is used as the gate first metal film 2 corresponding to the lower layer of the first metal laminated film 19a and an aluminum film or an aluminum alloy film is used as the gate second metal layer 3 stacked thereon, the gate line 4, the gate electrode 4a and the gate line external leading electrode 4b can be easily patterned by the dry etching. In addition, in forming the gate line external leading terminal 4c, the first metal laminated film 19a can be selectively etched so as to allow the lower titanium film alone to remain through the wet etching and a portion corresponding to the aluminum film or the aluminum alloy film stacked thereon in the first metal laminated film 19a can be removed.

As described above, when the lower layer of the first metal laminated film 19a is made of a titanium film, since a titanium film is less oxidized than an aluminum film or an aluminum alloy film, the gate line external leading terminal 4c made of the titanium film can be definitely electrically connected to an external driver circuit by the TAB method, and the reliability can be improved.

At this point, in the TAB method, a lead interconnect pattern of a copper foil formed in a tape-shaped film including a polyimide resin as a base is used for electrically connecting, for example, conductive materials to each other.

Furthermore, when the gate first metal film 2 corresponding to the upper layer of the first metal laminated film 19a is made of an aluminum film or an aluminum alloy film, an effect to lower the wiring resistance can be attained, and in addition, the selective etching for allowing the titanium film alone to remain can be definitely carried out by the wet etching.

As described so far, in the fabrication method of this embodiment, the TFT array substrate 30a can be fabricated through the three photolithography processes of the first, second and third steps including the formation of the protection masking layer 17a covering the TFT 20 and working as a black matrix between pixels, the formation of the protection 17b for realizing the MVA and the formation of the gate line external leading terminal 4c and the source line external terminal 12g. Therefore, the fabrication process can be shortened and the fabrication cost can be reduced for a TFT array substrate included in an MVA liquid crystal display.

Embodiment 2

A TFT array substrate 30b according to Embodiment 2 of the invention will now be described with reference to FIGS. 19 through 29. In this embodiment, like reference numerals are used to refer to like elements shown in FIGS. 1 through 18 so as to omit the detailed description.

The TFT array substrate 30b is included in a liquid crystal display together with an opposing counter substrate and a liquid crystal layer sandwiched between these substrates in the same manner as the TFT array substrate 30a of Embodiment 1.

In this TFT array substrate 30b, a gate line, a gate electrode 4a and a gate line external leading electrode 4b are formed in a three-layered structure of a gate first metal layer 21a, a gate second metal layer 22a and a gate third metal layer 23a; a semiconductor layer 24a, a source electrode 25b and a drain electrode 25c are formed in a one-layered structure; and a pixel electrode 25d is formed in a two-layered structure of the semiconductor layer 24a and the drain electrode 25c. The rest of the structure is the same as that of the TFT array substrate 30a of Embodiment 1 and hence the description is omitted.

Next, a method for fabricating the TFT array substrate 30b of Embodiment 2 will be described. This TFT array substrate 30b is fabricated through a first step of a gate electrode forming procedure; a second step including a laminated body forming procedure, a first resist pattern forming procedure, a first etching procedure, a second resist pattern forming procedure and a second etching procedure; and a third step of a pixel electrode forming procedure.

Figure 19:
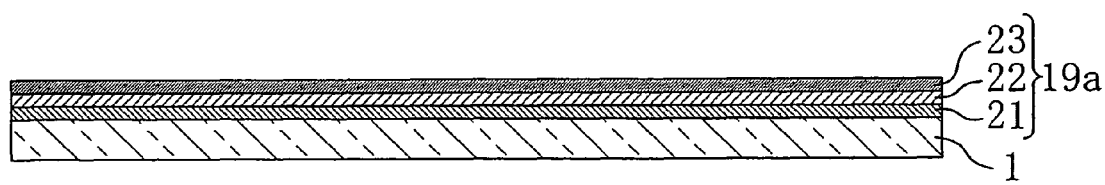
FIG. 19 is a schematic cross-sectional view of a substrate on which a first metal laminated film 19a is formed in a gate electrode forming procedure of Embodiment 2.
Figure 20:
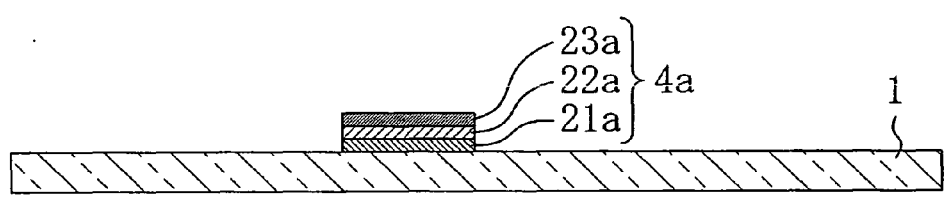
FIG. 20 is a schematic cross-sectional view of the substrate on which a gate electrode 4a is formed in the gate electrode forming procedure of Embodiment 2.

First, in the gate electrode forming procedure, a gate first metal film 21 (with a thickness of approximately 500 Å) of a titanium film, a gate second metal film 22 (with a thickness of approximately 3000 Å) of an aluminum film and a gate third metal film 23 (with a thickness of approximately 1000 Å) of a titanium nitride film are successively formed on an insulating substrate 1 of, for example, a glass substrate by the sputtering, so as to form a first metal laminated film 19a as shown in FIG. 19. Thereafter, the first metal laminated film 19a is patterned by the photolithography, so as to form a gate electrode 4a, a gate line and a gate line external leading electrode 4b all composed of a gate first metal layer 21a, a gate second metal layer 22a and a gate third metal layer 23a.

At this point, the metal film used as the gate first metal layer 21a is not particularly specified and is, for example, a titanium film, a chromium film, a molybdenum film or the like. Also, the metal film used as the gate second metal layer 22a is not particularly specified and is, for example, an aluminum film, a tantalum film, a titanium film or the like. Among these exemplified metal films, an aluminum film is preferably used. Furthermore, the metal film used as the gate third metal layer 23a is not particularly specified and is, for example, a titanium film, a titanium nitride film or the like. The reason why these metal films are selected will be described later.

Figure 21:
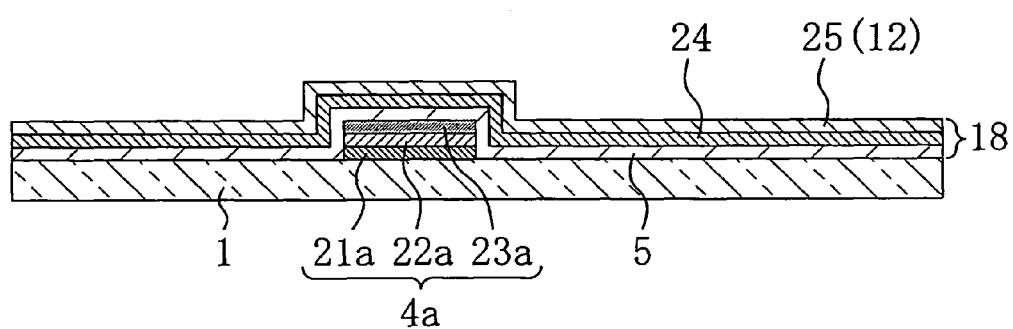
FIG. 21 is a schematic cross-sectional view of the substrate on which a multilayered body 18 is formed in a multilayered body forming procedure of Embodiment 2.

In the multilayered body forming procedure subsequently performed, a gate insulating film 5 (with a thickness of approximately 4000 Å) of a silicon nitride film is first deposited by the plasma CVD over the substrate on which the gate electrode 4a, the gate line and the gate line external leading electrode 4b have been formed as shown in FIG. 21. Then, a semiconductor film 24 (with a thickness of approximately 1500 Å) of a zinc oxide film is deposited by pulse laser CVD over the substrate on which the gate insulating film 5 has been formed. Furthermore, a transparent conducting film 25 (with a thickness of approximately 1000 Å) of an ITO film is deposited by the sputtering over the substrate on which the semiconductor film 24 has been formed.

Thus, a multilayered body 18 including the gate insulating film 5, the semiconductor film 24 and the transparent conducting film 25 stacked in this order in the upward direction is formed. At this point, a conducting film 12 is composed of merely the ITO film used as the transparent conducting film 25.

The semiconductor film 24 may be made of, apart from the exemplified zinc oxide film, a material having higher transmissivity than amorphous silicon with the same thickness, such as a zinc magnesium oxide film, a zinc cadmium oxide film or a cadmium oxide film.

Furthermore, the semiconductor film 24 may be doped with an impurity such as phosphorus to the extent that its transparency is not spoiled in order to attain desired mobility and a desired on/off ratio (that is, a ratio between a current passing in an on state and a leakage current caused in an off state in switching a drain current with a gate voltage).

The material for the transparent conducting film 25 is not particularly limited to the ITO film but may be any film with a desired resistance value such as an IZO (indium zinc oxide) film, a zinc oxide film, a tin oxide film or the like.

Owing to this structure, since a lower layer of the transparent conducting film 25 included in a pixel electrode 25d is made of the zinc oxide film 24 with a transparent property, the transmissivity in a region corresponding to the pixel electrode 25d can be improved, so as to improve the contrast and the brightness of the liquid crystal display.

Also, since the conducting film is composed of merely the transparent conducting film 25, there is no need to expose the transparent conducting film by etching a metal film as in Embodiment 1 in the third step described below. Therefore, a pixel electrode 25e can be formed by merely forming a protection masking layer 17a and a projection 17b in the third step. Thus, the fabrication process of the TFT array substrate can be shortened and the fabrication cost thereof can be reduced.

Figure 22:
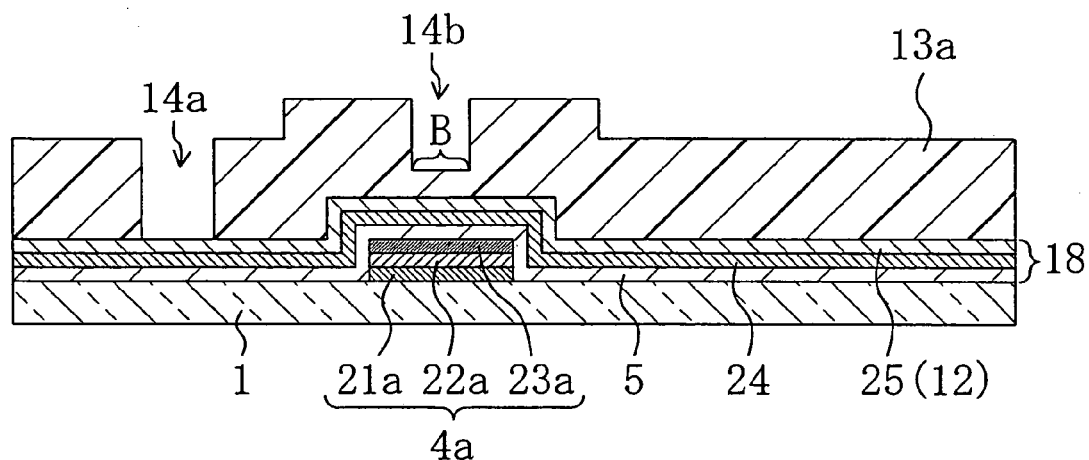
FIG. 22 is a schematic cross-sectional view of the substrate on which a resist pattern 13a is formed in a first resist pattern forming procedure of Embodiment 2.

In the first resist pattern forming procedure subsequently performed, a resist film is first formed by applying a resist of a photosensitive resin over the substrate. Then, the resist film formed over the substrate is made into a first resist pattern 13a having a plurality of thicknesses as shown in FIG. 22 with exposure adjusted by using a slit mask or the like.

At this point, the first resist pattern 13a includes a first opening 14a exposing the conducting film (the ITO film 25) and disposed above a portion other than a region where a channel portion C, a source line, a source electrode 25c and a drain electrode 25d are formed; and a second opening 14b having a bottom portion with a given thickness and disposed above the gate electrode 4a, and more specifically above a portion corresponding to the channel portion C. An appropriate ratio in the thickness between the resist film in the second opening 14b and the resist film in another portion is varied in accordance with the conditions for etching subsequently performed, and the resist film has a thickness of, for example, approximately 15000 through 20000 Å in the second opening 14b and approximately 40000 Å in another portion.

Figure 23:
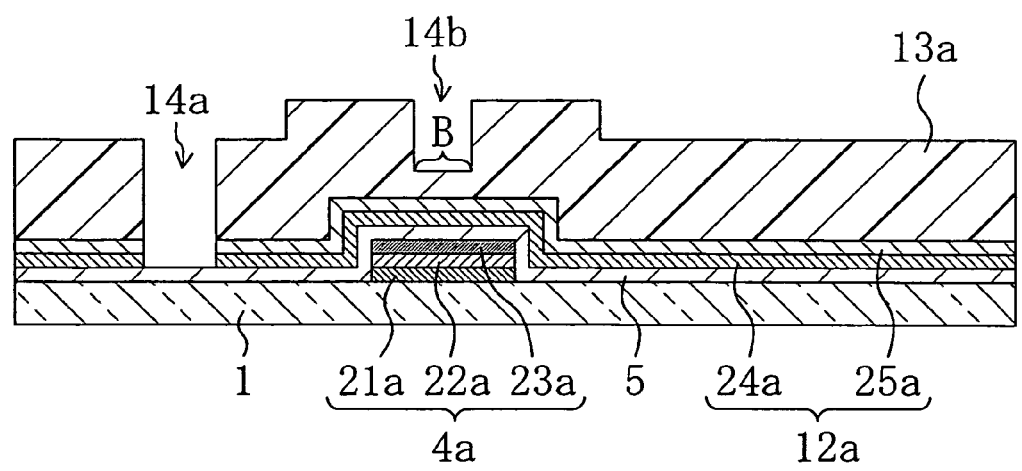
FIG. 23 is a schematic cross-sectional view of the substrate etched by using the first resist pattern 13a in a first etching procedure of Embodiment 2.

In the first etching procedure subsequently performed, the semiconductor film 24 and the transparent conducting film 25 are etched by using the first resist pattern 13a as a mask, so as to form a source/drain forming portion 12a composed of a semiconductor layer 24a and a transparent conducting layer 25a as shown in FIG. 23.

Figure 24:
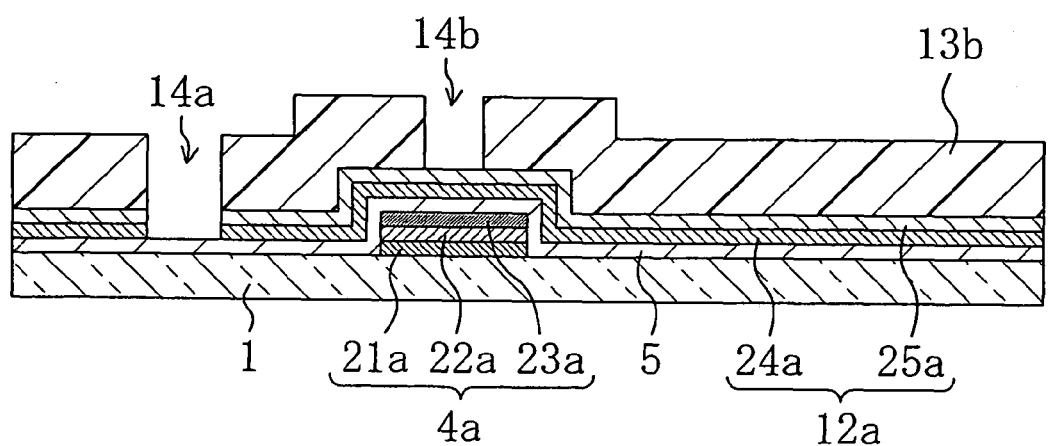
FIG. 24 is a schematic cross-sectional view of the substrate on which a second resist pattern 13b is formed in a second resist pattern forming procedure of Embodiment 2.
Figure 25:
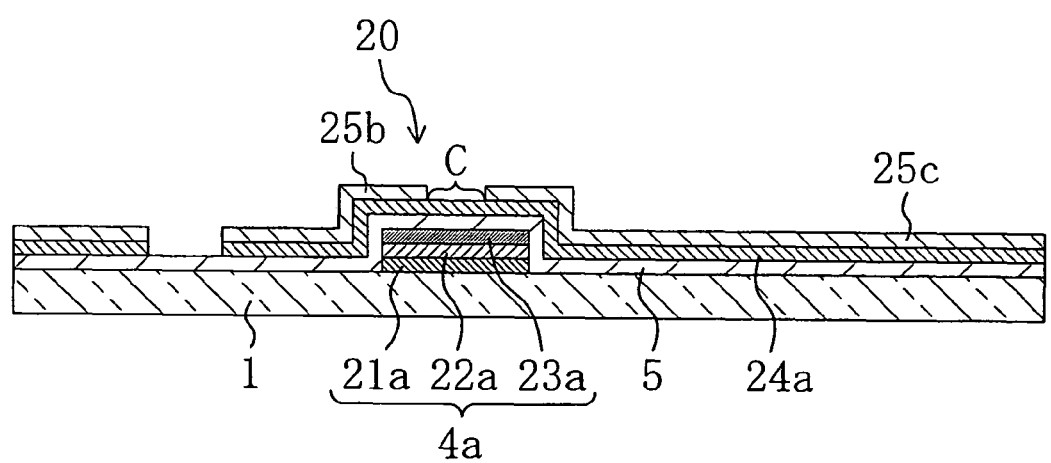
FIG. 25 is a schematic cross-sectional view of the substrate etched by using the second resist pattern 13b in a second etching procedure of Embodiment 2.

In the second resist pattern forming procedure subsequently performed, the first resist pattern 13a is wholly ashed as shown in FIG. 24. Thus, the thickness of the first resist pattern 13a is reduced as a whole and the bottom portion of the second opening 14b is removed, so as to form a second resist pattern 13b in which the ITO layer 25a is exposed.

In the second etching procedure subsequently performed, the transparent conducting layer 25a is first etched by using the second resist pattern 13b as a mask, so as to form a source electrode 25b, a drain electrode 25c, a source line and a source line external leading electrode. Thereafter, the second resist pattern 13b is removed from the substrate. Thus, a TFT 20 is formed.

In the pixel electrode forming procedure subsequently performed, a silicon nitride film (with a thickness of approximately 2000 Å) is first deposited over the substrate by the plasma CVD, so as to form a protection film 15.

Figure 26:
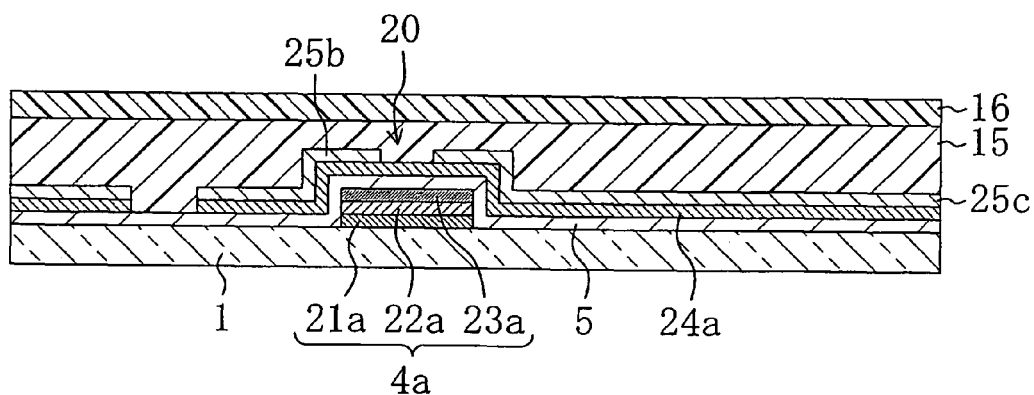
FIG. 26 is a schematic cross-sectional view of the substrate on which a protection film 15 and an orientation controlling film 16 are successively formed in a pixel electrode forming procedure of Embodiment 2.

Thereafter, in the same manner as in Embodiment 1, an orientation controlling film 16 (with a thickness of approximately 1.0 μm through 3.0 μm) is formed on the protection film 15 by the spin coating or the like as shown in FIG. 26.

Furthermore, the orientation controlling film 16 formed over the substrate is subjected to exposure with a photomask used, development and post-bake, so as to form a masking layer 16a and a projection upper portion 16b.

Figure 27:
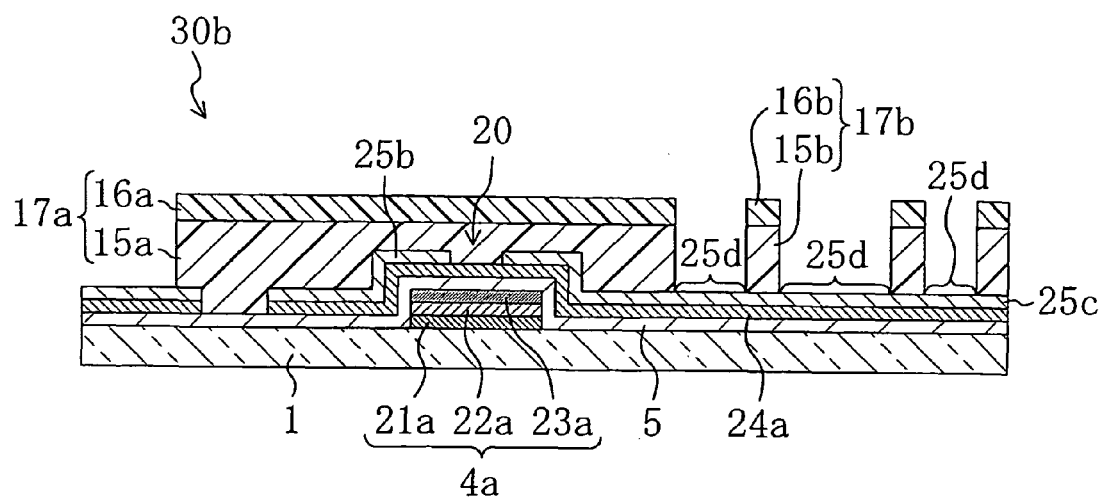
FIG. 27 is a schematic cross-sectional view of the substrate on which a pixel electrode 25d, a protection masking layer 17a and a projection 17b are formed in the pixel electrode forming procedure of Embodiment 2, corresponding to a schematic cross-sectional view of an active matrix substrate 30b.

Then, the protection film 15 is etched by using the masking layer 16a and the projection upper portion 16b as a mask, so as to form a protection masking layer 17a composed of the masking layer 16a and a protection layer 15a for covering the TFT 20; a projection 17b composed of the projection upper portion 16b and a projection lower portion 15b; and a pixel electrode 25d. Thus, the TFT array substrate 30b as shown in FIG. 27 is fabricated. Also, the protection masking layer 17a is formed so as to cover not only the TFT 20 but also gate lines 2 and source lines 6 for functioning as a black matrix.

At this point, the gate line external leading electrode 4b and the source line external leading electrode will be described in more detail.

Figure 28:
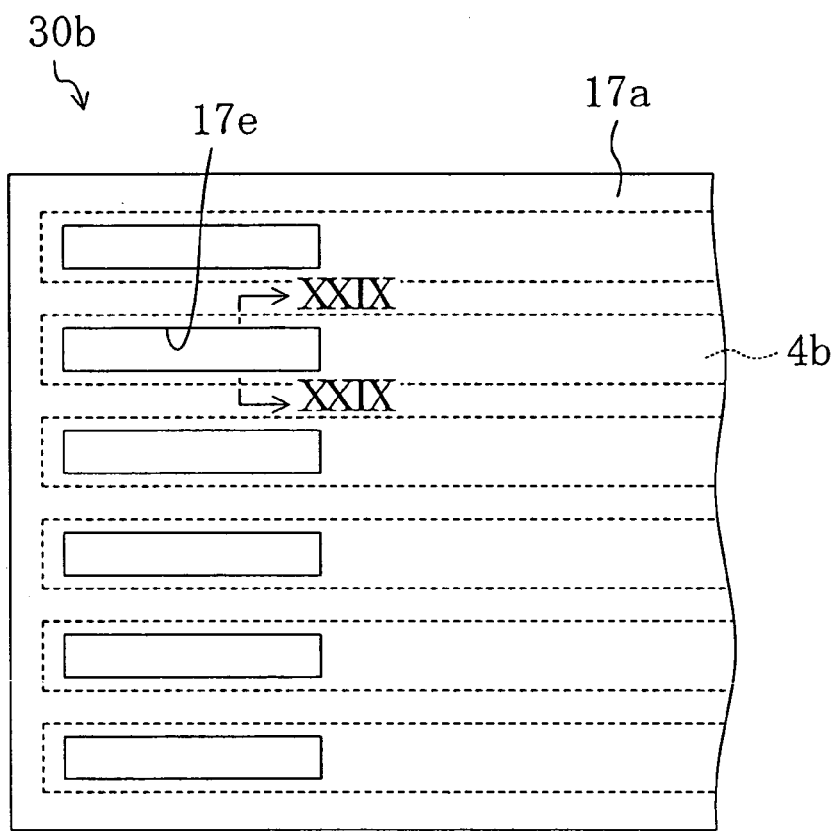
FIG. 28 is a schematic plan view of an end portion of the TFT array substrate 30b of Embodiment 2 showing a gate line external leading electrode 4b.
Figure 29:
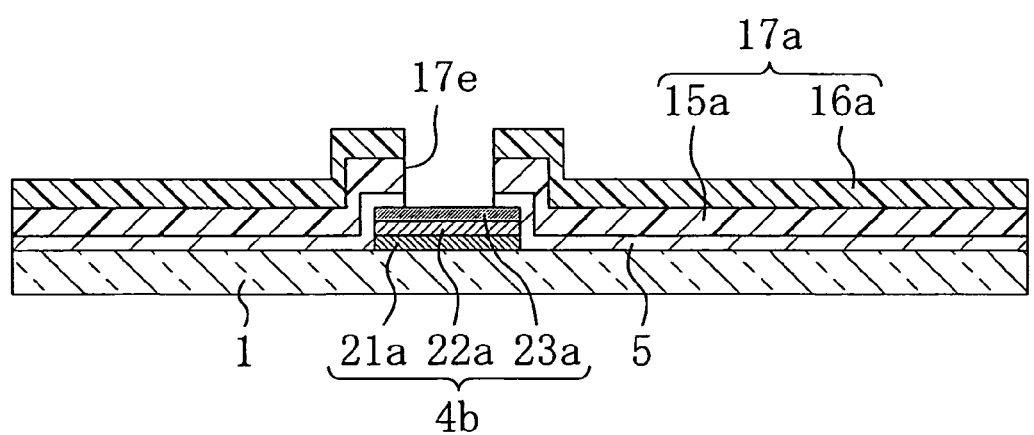
FIG. 29 is a schematic cross-sectional view of the TFT array substrate 30b taken on line XXIX-XXIX of FIG. 28.
Figure 30:
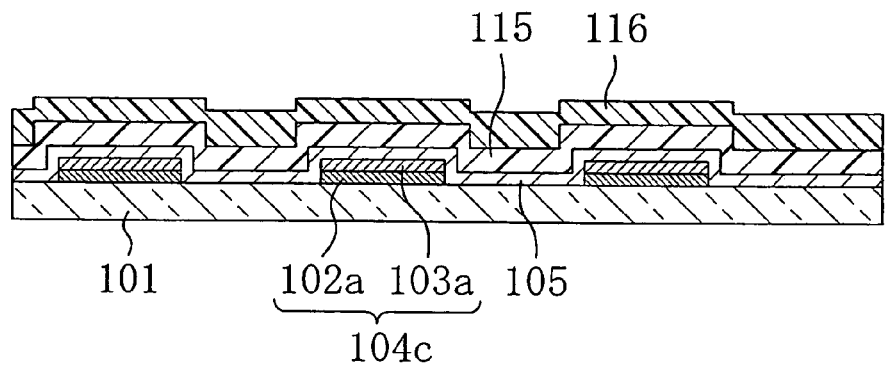
FIG. 30 is a schematic cross-sectional view corresponding to FIG. 13 obtained in a pixel electrode forming procedure described as a comparative example of Embodiment 1.
Figure 31:
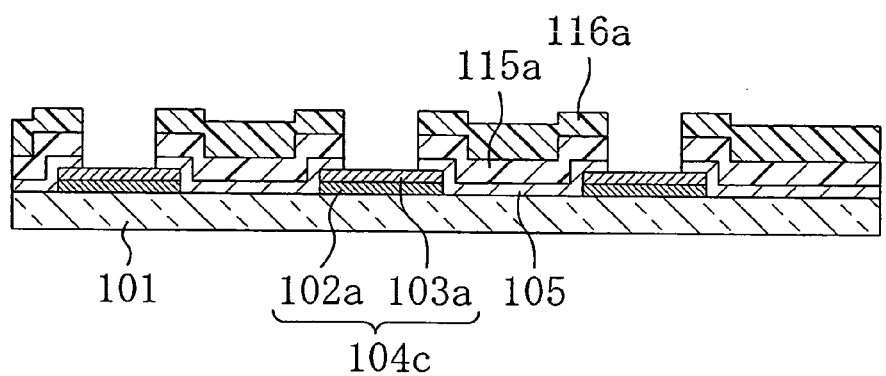
FIG. 31 is a schematic cross-sectional view corresponding to FIG. 14 obtained in a pixel electrode forming procedure described as a comparative example of Embodiment 1.

FIG. 28 is a schematic plan view of an end portion of the TFT array substrate 30b in which a plurality of gate line external leading electrodes 4b are formed, and FIG. 29 is a schematic cross-sectional view thereof taken on line XXIX-XXIX of FIG. 28.

Each gate line external leading electrode 4b is exposed, simultaneously with the formation of the pixel electrode 25d and the like, by forming a contact hole 17e in a portion of the multilayered film of the gate insulating film 5, the protection film 15 and the orientation controlling film 16 stacked on the gate line external leading electrode 4b and disposed inside the periphery of the gate line external leading electrode 4b. Therefore, the aluminum film included in the gate second metal layer 22a of the first metal laminated film 19a, which can be easily oxidized, is not exposed. Also, the gate third metal layer 23a, namely, the uppermost layer of the first metal laminated film 19a exposed by the etching, is a titanium nitride film minimally oxidized. Owing to this structure, the gate line external leading electrode 4b has a structure minimally oxidized. Accordingly, the gate line external leading electrode 4b and an external driver circuit can be definitely electrically connected to each other, so as to improve the reliability. Moreover, there is no need to form the gate line external leading terminal 4c by etching the gate second metal layer 3a (of the aluminum film) easily oxidized as in Embodiment 1, and hence, the fabrication process can be shortened and the fabrication cost can be reduced.

Furthermore, since a titanium nitride film or a titanium film has a higher adhesion property to the silicon nitride film used as the gate insulating film 5 than an aluminum film, the film is minimally peeled off and stable fabrication yield can be attained.

The source line external leading electrode is exposed, simultaneously with the formation of the pixel electrode 25d and the like, without etching the second metal laminated film 19b as in Embodiment 1 but merely by etching the protection film 15 and the orientation controlling film 16 formed thereon.

Since the gate second metal layer 22a is an aluminum film in this embodiment, an effect to lower the wiring resistance of the gate line can be attained. Moreover, since the gate third metal layer 23a formed thereon is a titanium nitride film, the formation of a hillock on the aluminum film can be suppressed, so as to reduce interlayer leakage between a gate line and a source line otherwise caused by a hillock.

In this manner, in the fabrication method of this embodiment, the TFT array substrate 30b is fabricated through the three photolithography processes of the first, second and third steps including the formation of the protection masking layer 17a covering the TFT 20 and working as a black matrix between pixels, the formation of the projection 17b used for realizing the MVA and the formation of the gate line external leading electrode 4b and the source line external leading electrode. Therefore, the fabrication process can be shortened and the fabrication cost can be reduced for a TFT array substrate included in an MVA liquid crystal display.

INDUSTRIAL APPLICABILITY

As described above, the present invention is useful for an MVA liquid crystal display because the fabrication process can be shortened and the fabrication cost can be reduced for a TFT array substrate included in the MVA liquid crystal display.

The invention claimed is:

1. A method for fabricating a thin film transistor array substrate including a plurality of pixels provided on a substrate; a plurality of thin film transistors corresponding to the plurality of pixels and each thin film transistor including a gate electrode, a source electrode, a drain electrode and a semiconductor layer having a channel portion; a source line connected to the source electrode; a pixel electrode connected to the drain electrode for applying a voltage through a liquid crystal layer including liquid crystal molecules; and a projection provided over the pixel electrode for controlling orientation of the liquid crystal molecules, comprising:

a first step of forming a pattern comprising the gate electrode on the substrate by photolithography;

a second step of forming a pattern comprising the thin film transistors including forming a multilayered body by stacking, on the substrate where the gate electrode has been formed, a gate insulating film, a semiconductor film to be made into the semiconductor layer and a conducting film including a transparent conducting film and covering the semiconductor film, and patterning the multilayered body by photolithography; and a third step including forming a protection layer covering the thin film transistors, forming the projection by patterning at least the protection layer, and forming the pixel electrode by exposing a part of the transparent conducting film by photolithography, the second step including a resist pattern forming procedure for forming a resist film covering the multilayered body, and forming, in the resist film, a first opening exposing the conducting film therein and disposed above a portion other than a region where the channel portion, the source line, the source electrode and the drain electrode are formed, and a second opening having a bottom portion with a given thickness and disposed above a portion of the multilayered body corresponding to the channel portion, so that when the first and second openings are formed in the resist film the first opening extends all the way through the resist film to expose the conducting film but the second opening does not extend all the way through the resist film; a first etching procedure for etching the conducting film exposed in the first opening and the semiconductor film disposed beneath the conducting film; and after the first etching procedure a second etching procedure for removing the bottom portion of the second opening to expose the conducting film and for etching the conducting film exposed therein.

2. The method of fabricating a thin film transistor array substrate of claim 1, wherein the conducting film has a masking property, and a portion of the conducting film disposed inside the periphery of the drain electrode is etched in the third step.

3. The method of fabricating a thin film transistor array substrate of claim 1, wherein the semiconductor film includes an upper first semiconductor film and a lower second semiconductor film, and the exposed conducting film and the first semiconductor film are etched in the second etching procedure.

4. The method of fabricating a thin film transistor array substrate of claim 1, wherein a masking layer is formed as an upper layer or a lower layer of the protection layer, and the masking layer is formed simultaneously with the protection layer in the third step.

5. The method of fabricating a thin film transistor array substrate of claim 1, wherein the protection layer is made of a material with a masking property.

6. The method of fabricating a thin film transistor array substrate of claim 1, wherein the gate electrode is made of a first metal laminated film including a plurality of metal films stacked on one another, and the first metal laminated film includes a metal film made of an aluminum film or an aluminum alloy film.

7. The method of fabricating a thin film transistor array substrate of claim 1, wherein the conducting film includes a single layer of the transparent conducting film.

8. The method of fabricating a thin film transistor array substrate of claim 1, wherein the conducting film includes the transparent conducting film made of a compound of indium oxide and tin oxide, and a second metal laminated film covering the transparent conducting film and including a plurality of metal films stacked on one another, and
the second metal laminated film includes a lower layer of a molybdenum film or a molybdenum alloy film and an upper layer of an aluminum film or an aluminum alloy film.

9. The method of fabricating a thin film transistor array substrate of claim 1, wherein the semiconductor film is made of a material with higher transmissivity than amorphous silicon with the same thickness.

10. The method of fabricating a thin film transistor array substrate of claim 1, wherein a plurality of gate lines each connected to the gate electrode and a gate line external leading electrode corresponding to an extended portion of each gate line are formed simultaneously with the gate electrode in the first step.

11. The method of fabricating a thin film transistor array substrate of claim 10, wherein the gate electrode, the gate line and the gate line external leading electrode are made of a first metal laminated film including a plurality of metal films stacked on one another, the first metal laminated film includes a titanium film or a titanium alloy film as a lowermost layer, and a portion of the titanium film or the titanium alloy film corresponding to the gate line external leading electrode is exposed by etching in the third step.

12. The method of fabricating a thin film transistor array substrate of claim 11, wherein the first metal laminated film includes the titanium film or the titanium alloy film as the lowermost layer, a metal film made of an aluminum film or an aluminum alloy film, and a molybdenum film or a molybdenum alloy film covering the metal film.

13. The method of fabricating a thin film transistor array substrate of claim 10, wherein the gate electrode, the gate line and the gate line external leading electrode are made of a first metal laminated film including a plurality of metal films stacked on one another, and the first metal laminated film includes a titanium film or a titanium alloy film as an uppermost layer.

14. The method of fabricating a thin film transistor array substrate of claim 13, wherein the first metal laminated film includes an aluminum film or an aluminum alloy film, and portions of the protection layer and the gate insulating film disposed inside the periphery of the gate line external leading electrode are etched in the third step.

15. The method of fabricating a thin film transistor array substrate of claim 10, wherein the source line and a source line external leading electrode corresponding to an extended portion of the source line are formed along a direction crossing the plurality of gate lines simultaneously with the source electrode in the second step.

16. The method of fabricating a thin film transistor array substrate of claim 15, wherein the gate electrode, the gate line and the gate line external leading electrode are made of a first metal laminated film including a plurality of metal films stacked on one another, the source electrode, the source line and the source line external leading electrode are made of a second metal laminated film including a plurality of metal films stacked on one another, and at least uppermost layers of the first metal laminated film and the second metal laminated film are removed by etching in portions corresponding to the gate line external leading electrode and the source line external leading electrode in the third step.

17. The method of fabricating a thin film transistor array substrate of claim 16, wherein the uppermost layer of each of the first metal laminated film and the second metal laminated film is made of an aluminum film or an aluminum alloy film, or a multilayered film of a molybdenum film or a molybdenum alloy film stacked on an aluminum film or an aluminum alloy film.

18. The method of fabricating a thin film transistor array substrate of claim 15, wherein the protection layer has a masking property and covers the thin film transistors, the gate line and the source line.

19. The method of fabricating a thin film transistor array substrate of claim 15, wherein the gate line external leading electrode and the source line external leading electrode are exposed by forming one opening correspondingly to at least one of the gate line external leading electrode and the source line external leading electrode by etching.

20. The method of fabricating a thin film transistor array substrate of claim 1, wherein a protection film included in the protection layer and the gate insulating film are etched in portions outside the periphery of the drain electrode in the third step.

* * * * *